(12) United States Patent
Kuwabara et al.

(10) Patent No.: US 10,197,822 B2
(45) Date of Patent: Feb. 5, 2019

(54) SEMICONDUCTOR DEVICE AND METHOD OF MANUFACTURING SAME

(71) Applicant: Renesas Electronics Corporation, Tokyo (JP)

(72) Inventors: Shinichi Kuwabara, Ibaraki (JP); Yasutaka Nakashiba, Ibaraki (JP); Tetsuya Iida, Ibaraki (JP); Shinichi Watanuki, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/878,619

(22) Filed: Jan. 24, 2018

(65) Prior Publication Data

US 2018/0299706 A1 Oct. 18, 2018

(30) Foreign Application Priority Data

Apr. 14, 2017 (JP) ................. 2017-080503

(51) Int. Cl.
| | |
|---|---|
| *G02F 1/025* | (2006.01) |
| *H01L 21/02* | (2006.01) |
| *H01L 29/06* | (2006.01) |
| *H01L 29/16* | (2006.01) |
| *H01L 21/3065* | (2006.01) |
| *H01L 21/311* | (2006.01) |
| *G02F 1/015* | (2006.01) |

(52) U.S. Cl.
CPC .......... *G02F 1/025* (2013.01); *H01L 21/0262* (2013.01); *H01L 21/02532* (2013.01); *H01L 21/02595* (2013.01); *H01L 21/3065* (2013.01); *H01L 21/31116* (2013.01); *H01L 29/0657* (2013.01); *H01L 29/16* (2013.01); *G02F 2001/0151* (2013.01); *G02F 2201/302* (2013.01); *G02F 2202/105* (2013.01)

(58) Field of Classification Search
CPC ............... G02F 1/025; G02F 2201/066; G02F 2201/30; G02F 2201/302
See application file for complete search history.

(56) References Cited

U.S. PATENT DOCUMENTS

| | | | |
|---|---|---|---|
| 8,532,440 B2 | 9/2013 | Ushida et al. | |
| 9,829,627 B2 * | 11/2017 | Usami | ..................... G02B 6/122 |
| 9,874,693 B2 * | 1/2018 | Baiocco | ................... G02B 6/13 |

FOREIGN PATENT DOCUMENTS

JP 2011-180595 A 9/2011

\* cited by examiner

*Primary Examiner* — Omar R Rojas
(74) *Attorney, Agent, or Firm* — Mattingly & Malur, PC

(57) ABSTRACT

To reduce a production cost of a semiconductor device and provide a semiconductor device having improved characteristics. A grating coupler has a plurality of projections separated from each other in an optical waveguide direction and a slab portion formed between any two of the projections adjacent to each other and formed integrally with them; a MOS optical modulator has a projection extending in the optical waveguide direction and slab portions formed on both sides of the projection, respectively, and formed integrally therewith. The projection of the grating coupler and the MOS optical modulator is formed of a first semiconductor layer, a second insulating layer, and a second semiconductor layer stacked successively on a first insulating layer, while the grating coupler and the MOS optical modulator each have a slab portion formed of the first semiconductor layer.

14 Claims, 33 Drawing Sheets

FIG. 3
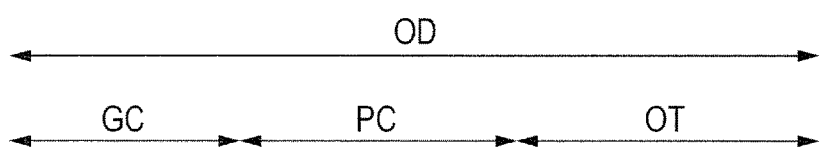
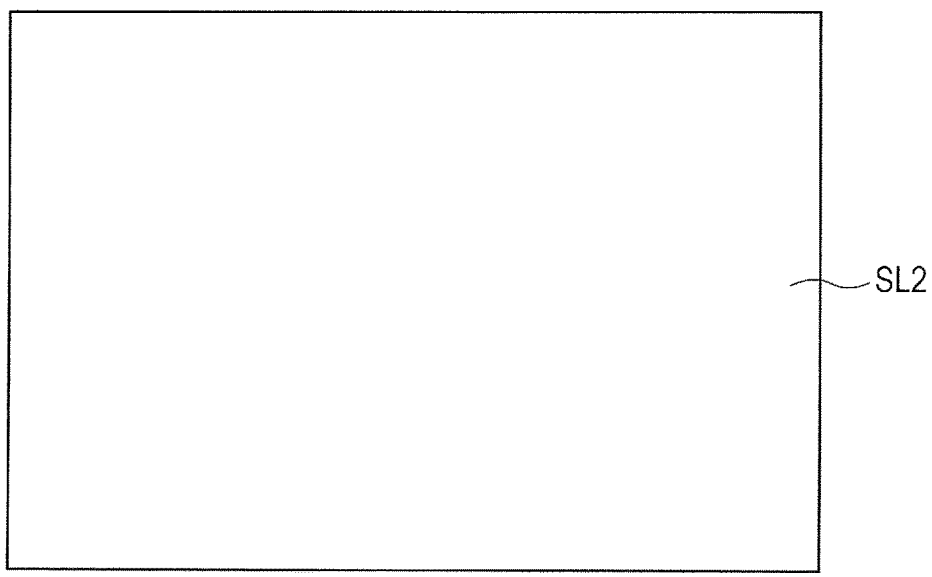

SEMICONDUCTOR DEVICE AND METHOD OF MANUFACTURING SAME

CROSS-REFERENCE TO RELATED APPLICATIONS

The disclosure of Japanese Patent Application No. 2017-080503 filed on Apr. 14, 2017 including the specification, drawings, and abstract is incorporated herein by reference in its entirety.

BACKGROUND

The present invention relates to a semiconductor device and a method of manufacturing same and is suited for use, for example, in a semiconductor device having a built-in silicon photonic device.

Japanese Unexamined Patent Application Publication No. 2011-180595 (Patent Document 1) describes an electro-optical device which has, in a slab portion of its rib waveguide, a region to which a metal electrode has been coupled and in which the slab portion is thicker in the region to which a metal electrode has been coupled than at the periphery of the region. In this electro-optical device, a MOS (metal oxide semiconductor) optical modulator is comprised of this rib waveguide.

PATENT DOCUMENT

[Patent Document 1] Japanese Unexamined Patent Application Publication No. 2011-180595

SUMMARY

There is proposed a technology of achieving a MOS optical modulator by using a silicon platform, for example, as described in Patent Document 1. Manufacture of a MOS optical modulator using a SOI (silicon on isolation) substrate having thereon a rib waveguide however has problems such as complex manufacturing steps and a high production cost. In addition, there is a further demand for the improvement in the characteristics of the MOS optical modulator and a grating coupler.

Another problem and a novel feature will be apparent from the description herein and accompanying drawings.

A semiconductor device according to one embodiment has, on a first insulating layer formed on the main surface of a semiconductor substrate, a grating coupler and a MOS optical modulator. The grating coupler has a plurality of first projections separated from each other in an optical waveguide direction and a first slab portion formed between any two of the first projections adjacent to each other, formed integrally with them, and having a height lower than that of the first projections. The MOS optical modulator has a second projection extending along the optical waveguide direction and second slab portions formed on both sides of the second projections, respectively, and integrally with the second projection and having a height lower than that of the second projection. The first projections and the second projection are each formed of a first semiconductor layer, a second insulating layer, and a second semiconductor layer stacked successively on the first insulating layer and the first slab portion and the second slab portion are each formed of the first semiconductor layer.

A method of manufacturing a semiconductor device in one embodiment includes a step of providing a semiconductor substrate obtained by successively forming, on the main surface of a semiconductor substrate, a first insulating layer, a first semiconductor layer comprised of single crystal silicon, a second insulating layer, and a second semiconductor layer comprised of single crystal silicon; and a step of successively etching the second semiconductor layer, the second insulating layer, and the first semiconductor layer. By this etching, formed in a grating coupler formation region are a plurality of first projections comprised of the first semiconductor layer, the second insulating layer, and the second semiconductor layer and separated from one another in an optical waveguide direction and a first slab portion comprised of the first semiconductor layer and positioned between any two of the first projections adjacent to each other. Also by this etching, formed in a MOS optical modulator formation region are a second projection comprised of the first semiconductor layer, the second insulating layer, and the second semiconductor layer and extending along the optical waveguide direction and second slab portions comprised of the first semiconductor layer and positioned on both sides of the second projection, respectively.

Reduction in the production cost of a semiconductor device and improvement in the characteristics of a semiconductor device can be achieved according to the embodiment.

BRIEF DESCRIPTION OF THE DRAWINGS

FIG. 3 a fragmentary plan view of the optical device of the embodiment shown in FIG. 2;

DETAILED DESCRIPTION

Figure 1:
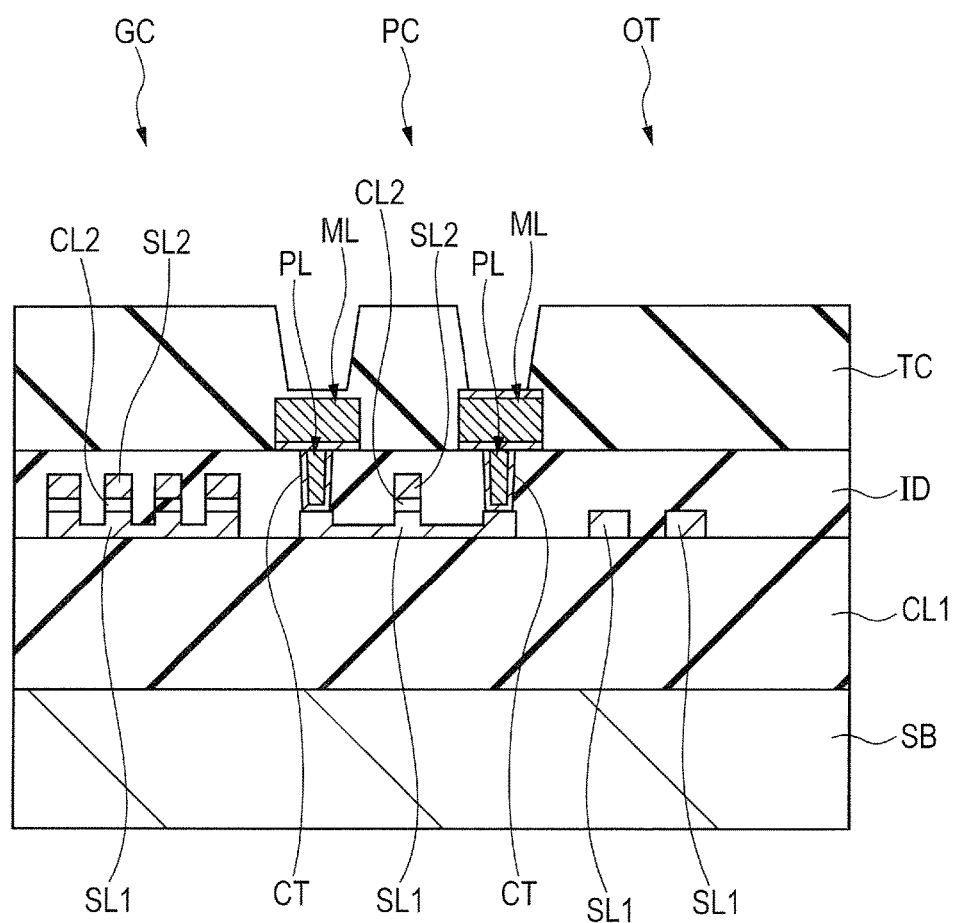
FIG. 1 is a fragmentary cross-sectional view showing an optical signal line, a grating coupler, and a MOS optical modulator according to the embodiment.

In the below-described embodiment, a description will be made after divided into a plurality of sections or embodiments if necessary for the sake of convenience. These sections or embodiments are not independent from each other unless otherwise particularly specified, but one of them may be a modification example, details, a complementary description, or the like of a part or whole of the other one.

In the below-described embodiment, when a reference is made to the number or the like (including the number, value, amount, range, or the like) of a component, the number is not limited to a specific number but may be more or less than the specific number, unless otherwise particularly specified or principally apparent that the number is limited to the specific number.

Further, it is needless to say that in the below-described embodiment, the constituent component (including component step or the like) is not always essential unless otherwise particularly specified or principally apparent that it is essential.

It is needless to say that when the term "is comprised of A", "is comprised of A", "has A", or "includes A" is used, a component other than A is not excluded unless otherwise indicated that the component is only A. Similarly, in the below-described embodiment, when a reference is made to the shape, positional relationship, or the like of the constituent component, a component substantially approximate or analogous thereto in shape or the like is also embraced unless otherwise particularly specified or principally apparent that it is not. This also applies to the above-described number and range.

In all the drawings for describing the following embodiment, members of a like function will be identified by like reference numerals in principle and overlapping descriptions will be omitted. In the cross-sectional views, the size of each site does not correspond to that of an actual device and in order to facilitate understanding of the drawings, certain sites may be sometimes enlarged relatively.

The embodiment will hereinafter be described in detail based on drawings.

Embodiment

<Structure of Optical Device>

The structure of various optical devices configuring the semiconductor device of the present embodiment will be described referring to FIG. 1. FIG. 1 is a fragmentary cross-sectional view showing an optical signal line (transmission line for optical signals), a grating coupler, and a MOS optical modulator according to the present embodiment.

FIG. 1 shows the respective cross-sections of the optical signal line OT and the MOS optical modulator PC orthogonal to an optical waveguide direction (light propagation direction) and the cross-section of the grating coupler GC in the optical waveguide direction. The optical signal line has various structures, but in the present embodiment, an optical signal line which is rectangular in the cross-section orthogonal to the optical waveguide direction is shown as an example.

As shown in FIG. 1, a semiconductor substrate SB comprised of single crystal silicon (Si) has, on the main surface thereof, the optical signal line OT, the grating coupler GC, and the MOS optical modulator PC via a first insulating layer (also called BOX layer or lower clad layer) CL1. The first insulating layer CL1 is relatively thick with a thickness of, for example, about 2.0 μm. This makes it possible to reduce the electrostatic capacity between the semiconductor substrate SB and the optical signal line OT, the grating coupler GC, and the MOS optical modulator PC.

The respective structures of the optical signal line OT, the grating coupler GC, and the MOS optical modulator PC will hereinafter be described.

<Optical Signal Line>

As shown in FIG. 1, the optical signal line OT is comprised of a first semiconductor layer SL1 comprised of single crystal silicon (Si) and it is rectangular in the cross-section orthogonal to the optical waveguide direction. The optical signal line OT has a height of, for example, about 0.2 μm. The width of the optical signal line OT in the cross-section orthogonal to the optical waveguide direction is, for example, from about 0.1 μm to 0.5 μm and as a typical value of it, 0.45 μm can be exemplified.

In the present embodiment, the optical signal line OT whose cross-section orthogonal to the optical waveguide direction has a rectangular shape is given as an example. The optical signal line is not limited to it. For example, an optical signal line whose cross-section orthogonal to the optical waveguide direction has a protruding shape and thus has a projection may be used. In other words, an optical signal line having a projection extending along the optical waveguide direction and slab portions formed on both sides of the projection, respectively, and formed integrally with the projection may be used.

The optical signal line OT is covered with an interlayer insulating film (also called upper clad layer) ID. The interlayer insulating film ID has thereon a protective film TC. The interlayer insulating film ID is comprised of, for example, silicon oxide (SiO$_2$). The protective film TC is comprised of, for example, silicon oxide (SiO$_2$), silicon oxynitride (SiON), PSG (phospho silicate glass), or silicon nitride (SiN). The optical signal line OT has thereabove no wiring ML which will be described later.

<Grating Coupler>

As shown in FIG. 1, the grating coupler GC has a rib structure. The cross-section of the grating coupler GC along the optical waveguide direction has a protruding shape. The grating coupler GC has a plurality of projections which are separated from one another in the optical waveguide direction. In other words, the grating coupler GC has a plurality of projections separated from one another in the optical waveguide direction and a slab portion formed between any two of the projections adjacent to each other, formed integrally with the projections, and having a height lower than that of the projections.

More specifically, the first insulating layer CL1 has thereon a first semiconductor layer SL1 comprised of single crystal silicon (Si) and having a rib structure. The first semiconductor layer SL1 has a plurality of projections separated from one another in the optical waveguide direction and a slab portion formed between any two of the projections adjacent to each other, formed integrally with these projections, and having a height lower than that of the projections. It functions as an optical waveguide. The height of the projections of the first semiconductor layer SL1 is, for example, about 0.2 μm and is equal to that of the optical signal line OT.

Further, the plurality of projections of the first semiconductor layer SL1 has thereon, via a second insulating layer CL2, a second semiconductor layer SL2 functioning as an optical waveguide. This means that the projection of the grating coupler GC is comprised of the projection of the first semiconductor layer SL1, the second insulating layer CL2, and the second semiconductor layer SL2 and the slab portion of the grating coupler GC is comprised of the slab portion of the first semiconductor layer SL1.

The second insulating layer CL2 is comprised of, for example, silicon oxide (SiO$_2$) and the second semiconductor layer SL2 is comprised of, for example, single crystal silicon (Si). A thickness of the second insulating layer CL2 is, for example, from about 0.002 μm to 0.01 μm and as a typical value of it, 0.005 μm can be exemplified. The thickness of the second semiconductor layer SL2 is, for example, from about 0.1 μm to 0.3 μm and as a typical value of it, 0.16 μm can be exemplified.

The height of the projection of the grating coupler GC therefore corresponds to a height obtained by stacking the projection of the first semiconductor layer SL1, the second insulating layer CL2, and the second semiconductor layer SL2 one after another and is by about twice higher than the height of the optical signal line OT comprised of the first semiconductor layer SL1.

The grating coupler GC is an optical device that couples a laser light incident from the outside to a light propagating through a light waveguide or emits a light propagating through an optical waveguide to the outside. The light propagating through the grating coupler GC is diffracted and radiated to a certain direction by periodic refractive index modulation provided on the light waveguide surface along the propagation direction. Accordingly, when the projection of the grating coupler GC becomes higher, the amount of light diffracted and radiated increases. For example, when the projection of the grating coupler GC has a height about twice the original height, about a 20% improvement in the characteristics of the grating coupler GC can be achieved.

The grating coupler GC is covered with an interlayer insulating film ID. The interlayer insulating film ID has thereon a protective film TC. The grating coupler GC has thereabove no wiring ML which will be described later. The grating coupler GC sometimes does not have thereabove the protective film TC.

<MOS Optical Modulator>

As shown in FIG. 1, the MOS optical modulator PC has a rib structure. The cross-section of the MOS optical modulator PC orthogonal to the optical waveguide direction has a protruding shape. The MOS optical modulator PC has a projection extending along the optical waveguide direction. In other words, the MOS optical modulator PC has a projection which extends along the optical waveguide direction and will be a light propagating core layer, and slab portions formed on both sides thereof, respectively, formed integrally with the projection, and having a height lower than that of the projection.

Described specifically, the first insulating layer CL1 has thereon a first semiconductor layer SL1 comprised of first conductivity type (for example, p type) single crystal silicon (Si) and having a rib structure. The first semiconductor layer SL1 has a projection extending along the optical waveguide direction and slab portions formed on both sides of the projection, respectively, formed integrally with the projection, and having a height lower than that of the projection. The projection functions as a light waveguide. The height of the projection of the first semiconductor layer SL1 is, for example, about 0.2 µm and equal to that of the optical signal line OT.

Both end portions of the slab portion at the cross-section orthogonal to the optical waveguide direction are portions to which a wiring ML1 which will be described later is electrically coupled. At this wiring coupling portions, the first semiconductor layer SL1 has an increased thickness. The height of the projection of the first semiconductor layer SL1 is equal to the height of the wiring coupling portion of the first semiconductor layer SL1. The height of the wiring coupling portion of the first semiconductor layer SL1 is set equal to that of the projection of the first semiconductor layer SL1, but it may be set lower than the height of the projection of the first semiconductor layer SL1.

Further, the first semiconductor layer SL1 has, on the projection thereof, a second semiconductor layer SL2 functioning as an optical waveguide via the second insulating layer CL2. This means that the projection of the MOS optical modulator PC is comprised of the projection of the first semiconductor layer SL1, the second insulating layer CL2, and the second semiconductor layer SL2, while the slab portion of the MOS optical modulator PC is comprised of the slab portion of the first semiconductor layer SL1.

The second insulating layer CL2 is comprised of, for example, silicon oxide ($SiO_2$) and the second semiconductor layer SL2 is comprised of, for example, single crystal silicon (Si) having a second conductivity type (for example, n type) different from the first conductivity type. The thickness of the second insulating layer CL2 is, for example, from about 0.002 µm to 0.01 µm and as a typical value of it, 0.005 µm can be exemplified. The thickness of the second semiconductor layer SL2 is, for example, from about 0.1 µm to 0.3 µm and as a typical value of it, 0.16 µm can be exemplified.

In the MOS optical modulator PC, the projection of the first semiconductor layer SL1 and the second semiconductor layer SL2 provided right thereabove serve as a light propagating core layer. In other words, the core layer which is a main body of the light waveguide of the MOS optical modulator PC is formed of the first semiconductor layer SL1 which is a p type semiconductor and the second semiconductor layer SL2 which is an n type semiconductor provided via the second insulating layer CL2.

In the MOS optical modulator PC, when a reverse bias voltage is applied between the first semiconductor layer SL1 which is a p type semiconductor and the second semiconductor layer SL2 which is an n type semiconductor, the light propagating through the core layer is subjected to a modulation operation for changing an effective refractive index and the phase of light output from the MOS optical modulator can be changed.

Since the first semiconductor layer SL1 and the second semiconductor layer SL2 configuring the MOS optical modulator PC are comprised of single crystal silicon (Si), the second insulating layer CL2 located between the first semiconductor layer SL1 and the second semiconductor layer SL2 that configure the core layer is superior in thickness uniformity. For example, when the second semiconductor layer SL2 configuring the core layer is comprised of polycrystalline silicon (Si) (refer to Patent Document 1), the grains of the polycrystalline silicon (Si) may make the thickness of the second insulating layer CL2 uneven. In the present embodiment, however, such uneven thickness of the second insulating layer CL2 can be avoided. As a result, variation in refractive index can be reduced so that the phase of light can be changed with good precision in the MOS optical modulator PC.

The MOS optical modulator PC is covered with the interlayer insulating film ID. The interlayer insulating film ID is comprised of, for example, silicon oxide ($SiO_2$) and it has a thickness of, for example, from about 1 µm to 2 µm.

The interlayer insulating film ID has thereon a wiring ML. The wiring ML is comprised of a main conductive material comprised of, for example, aluminum (Al) or copper (Cu) and a barrier metal formed on the lower and upper surfaces of the main conductive material. The barrier metal is provided to prevent diffusion of the metal of the main conductive material configuring the wiring ML and is comprised of, for example, tantalum (Ta), titanium (Ti), tantalum nitride (TaN), or titanium nitride (TiN). It has a thickness of, for example, from about 5 nm to 20 nm.

The interlayer insulating film ID further has therein a coupling hole (not illustrated) reaching the second semiconductor layer SL2 on the projection of the first semiconductor layer SL1 and a coupling hole CT reaching the wire coupling portion of the first semiconductor layer SL1. These coupling holes CT have, inside thereof, a plug PL having tungsten (W) or the like as a main conductive material and using a barrier metal in combination. The barrier metal is provided to prevent diffusion of the metal of the main conductive material configuring the plug PL and it is comprised of, for example, titanium (Ti) or titanium nitride (TiN). It has a thickness of, for example, from about 5 nm to 20 nm. Through this plug PL, the second semiconductor layer SL2 on the projection of the first semiconductor layer SL1 is electrically coupled to the wiring ML and the wiring coupling portion of the first semiconductor layer SL1 is electrically coupled to the wiring ML.

The wiring ML is covered with a protective film TC and it is partially opened. From this opening, the upper surface of the wiring ML is exposed. The wiring illustrated here is a monolayer wiring, but it may have a multilayer structure comprised of two or more layers.

<Method of Manufacturing Optical Device>

A method of manufacturing an optical device according to the present embodiment will be described in order of steps referring to FIGS. 2 to 32. FIGS. 2, 4, 6, 8, 10, 12, 14, 16, 18, and 20, and from 22 to 31 each include respective fragmentary cross-sectional views of optical devices. FIGS. 3, 5, 7, 9, 11, 13, 15, 17, 19, 21, and 32 are each a fragmentary plan view of these optical devices. The method of manufacturing an optical device according to the present embodiment will be described while comparing with a method of manufacturing an optical device of Comparative Example.

In the present embodiment, the method of manufacturing an optical device is, more specifically, that of manufacturing the optical signal line OT, the grating coupler GC, and the MOS optical modulator PC. Similarly, in Comparative Example, the method of manufacturing an optical device is, more specifically, that of an optical signal line OTR, a grating coupler GCR, and a MOS optical modulator PCR.

Full etching and half etching are used to process a semiconductor layer. The term "full etching" means dry etching of a semiconductor layer from the upper surface toward the lower surface thereof, while the term "half etching" means dry etching of a semiconductor layer from the upper surface thereof without etching a predetermined thickness of the layer. In the following description, the optical device of the present embodiment will be called "optical device OD" and the optical device of Comparative Example will be called "comparative optical device ODR".

Figure 2:
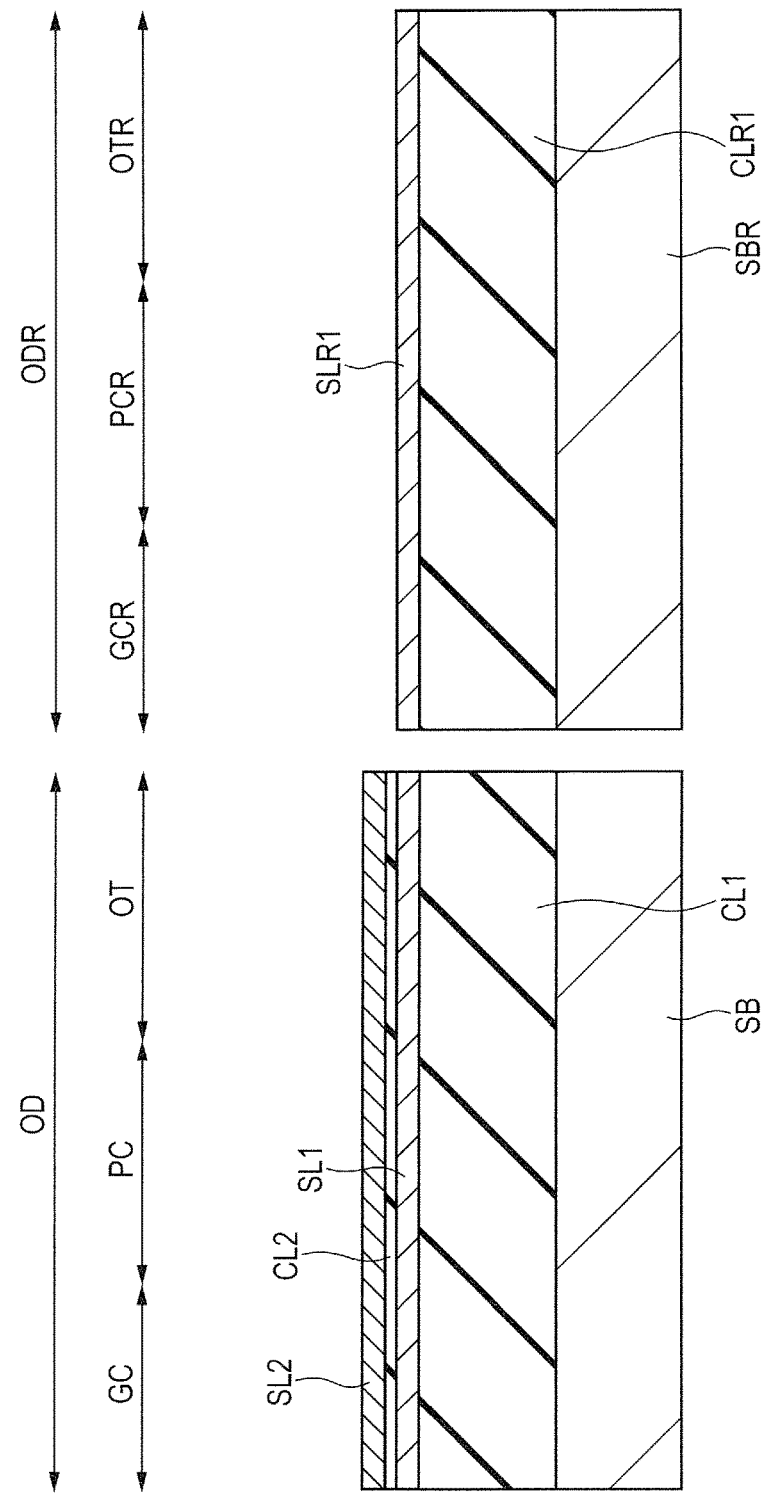
FIG. 2 includes a fragmentary cross-sectional view of an optical device of the embodiment during a manufacturing step thereof and a fragmentary cross-sectional view of an optical device of Comparative Example during a manufacturing step thereof.

As shown in FIGS. 2 and 3, provided for the optical device OD is a substrate (a substrate having a substantially round plane and called "wafer" in this stage) comprised of a semiconductor substrate SB, a first insulating layer CL1 formed on the main surface of the semiconductor substrate SB, a first semiconductor layer SL1 formed on the first insulating layer CL1, a second insulating layer CL2 formed on the first semiconductor layer SL1, and a second semiconductor layer SL2 formed on the second insulating layer CL2. In a region where the MOS optical modulator PC is to be formed, the first semiconductor layer SL1 and the second semiconductor layer SL2 have respectively different conductivity types. For example, the first semiconductor layer SL1 has a p type conductivity and the second semiconductor layer SL2 has an n type conductivity.

Provided for the comparative optical device ODR is a substrate (a substrate having a substantially round plane and called "wafer" in this stage) comprised of a semiconductor substrate SBR, a first insulating layer CLR1 formed on the main surface of the semiconductor substrate SBR, and a first semiconductor layer SLR1 formed on the first insulating layer CLR1. In a region where the MOS optical modulator PCR is to be formed, the first semiconductor layer SLR1 has, for example, a p type conductivity.

The semiconductor substrates SB and SBR are each a support substrate comprised of single crystal silicon (Si) and have a thickness of, for example, about 750 μm. The first insulating layers CL1 and CLR1, and the second insulating layer CL2 are each comprised of, for example, silicon oxide ($SiO_2$). The first insulating layers CL1 and CLR1 have a thickness of, for example, about 2.0 μm and the second insulating layer CL2 has a thickness of, for example, about 0.005 μm. The first semiconductor layers SL1 and SLR1 and the second semiconductor layer SL2 are each comprised of, for example, single crystal silicon (Si). The first semiconductor layers SL1 and SLR1 have a thickness of, for example, about 0.2 μm and the second semiconductor layer SL2 has a thickness of, for example, about 0.16 μm.

One example of a method of manufacturing a substrate (wafer) provided for the optical device OD will hereinafter be described (refer to, for example, Japanese Unexamined Patent Application Publication No. 2007-109961). It is however needless to say that the method of manufacturing a substrate (wafer) provided for the optical device OD is not limited thereto.

First, a first wafer comprised of single crystal silicon (Si) and a second wafer comprised of single crystal silicon (Si) are provided. Then, after implantation of an oxygen ion from the first main surface of the first wafer, thermal oxidation is performed to form a first silicon oxide ($SiO_2$) layer having a predetermined thickness on the first main surface of the first wafer. Similarly, after implantation of an oxygen ion from the first main surface of the second wafer, thermal oxidation is performed to form a second silicon oxide ($SiO_2$) layer having a predetermined thickness on the first main surface of the second wafer.

Then, the first wafer and the second wafer are laminated to bring the first silicon oxide ($SiO_2$) layer and the second silicon oxide ($SiO_2$) layer into contact with each other, followed by heat treatment to form a first insulating layer CL1 comprised of the first silicon oxide ($SiO_2$) layer and the second silicon oxide ($SiO_2$) layer. Then, the second wafer is thinned from the second main surface, which is a surface on the side opposite to the first main surface, for example, by grinding, polishing, or ion implantation separation to form a first semiconductor layer SL1 comprised of single crystal silicon (Si). By further thermal oxidation, a third silicon oxide ($SiO_2$) layer is formed on the surface of the first semiconductor layer SL1.

In addition, a third wafer comprised of single crystal silicon (Si) is provided. Then, after implantation of an oxygen ion from the first main surface of the third wafer, thermal oxidation is performed to form a fourth silicon oxide ($SiO_2$) layer having a predetermined thickness on the first main surface of the third wafer.

Then, the first wafer and the third wafer are laminated to bring the third silicon oxide ($SiO_2$) layer and the fourth silicon oxide ($SiO_2$) layer into contact with each other, followed by heat treatment to form a second insulating layer CL2 comprised of the third silicon oxide ($SiO_2$) layer and the fourth silicon oxide ($SiO_2$) layer. Then, the third wafer is thinned from the second main surface thereof, which is a surface on the side opposite to the first main surface, for example, by grinding, polishing, or ion implantation separation to form a second semiconductor layer SL2 comprised of single crystal silicon (Si).

By the above-described steps, a substrate (wafer) provided for optical device CD is manufactured, which has the first insulating layer CL1, the first semiconductor layer SL1, the second insulating layer CL2, and the second semiconductor layer SL2 stacked successively on the main surface of the semiconductor substrate SB.

Figure 4:
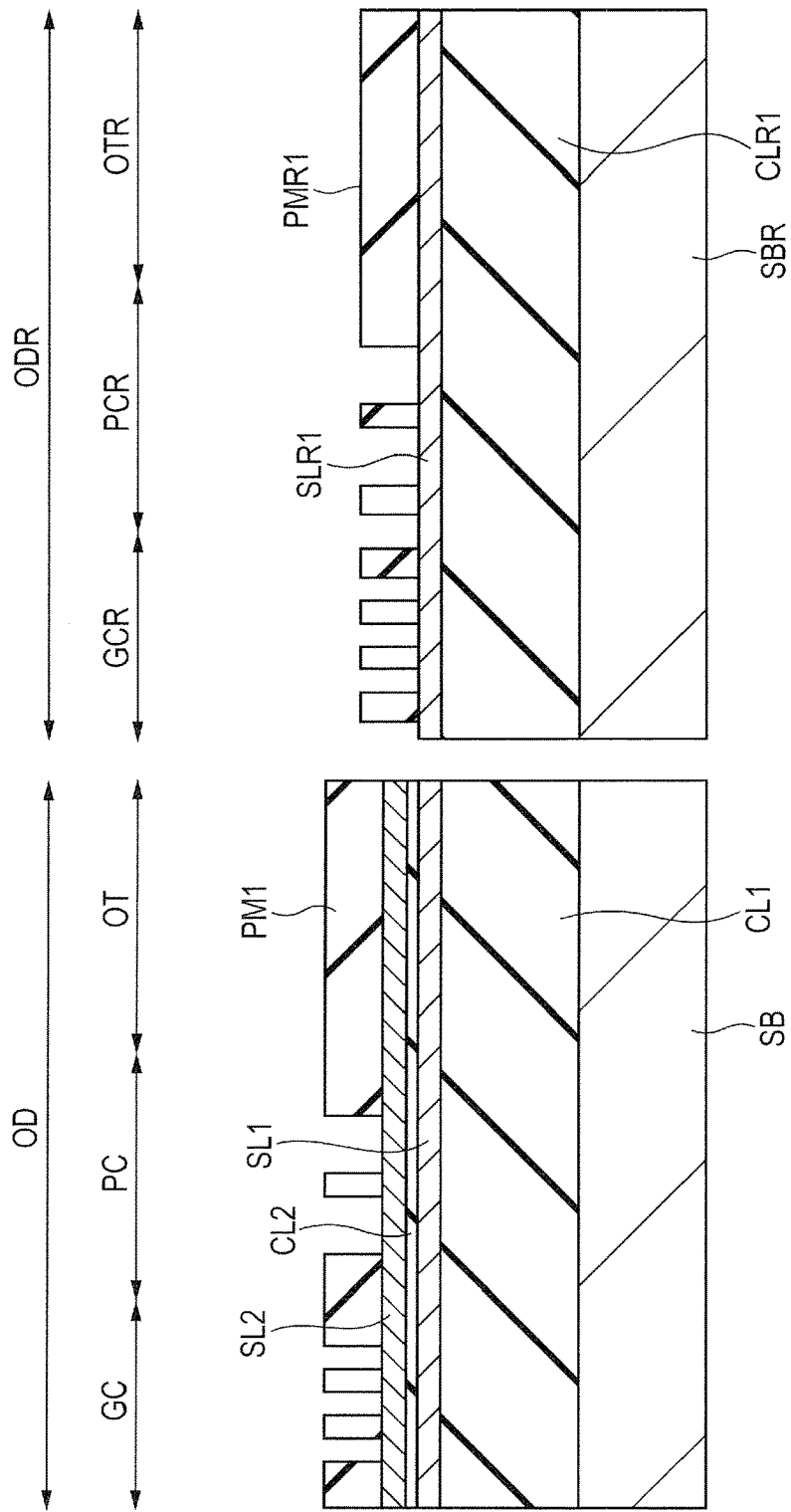
FIG. 4 includes a fragmentary cross-sectional view of the optical device of the embodiment during a manufacturing step thereof following that of FIG. 2 and a fragmentary cross-sectional view of the optical device of Comparative Example during a manufacturing step thereof following that of FIG. 2.
Figure 5:
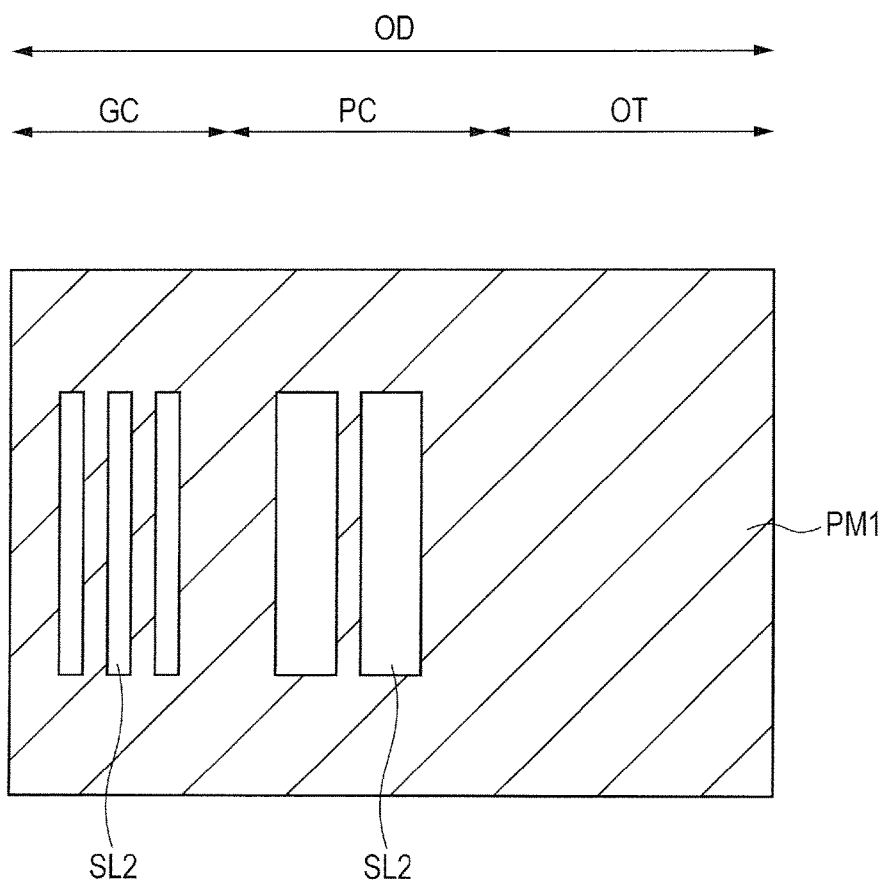
FIG. 5 is a fragmentary plan view of the optical device of the embodiment shown in FIG. 4.

Next, as shown in FIGS. 4 and 5, a first resist mask PM1 for successively processing the second semiconductor layer SL2, the second insulating layer CL2, and the first semiconductor layer SL1 is formed in the optical device OD.

In the comparative optical device ODR, a first resist mask PMR1 for processing the first semiconductor layer SLR1 is formed. In plan view, the pattern of the first resist mask PM1 and the pattern of the first resist mask PMR1 are almost the same.

A monolayer resist mask is shown in FIG. 4, but a multilayer resist mask may be used. The first resist mask PM1 used for the optical device OD is formed, for example, by applying a photoresist onto the upper surface of the second semiconductor layer SL2, subjecting it to liquid immersion exposure using an ArF excimer laser (wavelength: 193 nm), carrying out development treatment, and thereby patterning the photoresist. Similarly, the first resist mask PMR1 used for the comparative optical device ODR is formed, for example, by applying a photoresist onto the upper surface of the first semiconductor layer SLR1, subjecting it to liquid immersion exposure using an ArF excimer laser (wavelength: 193 nm), carrying out development treatment, and thereby patterning the photoresist.

Figure 6:
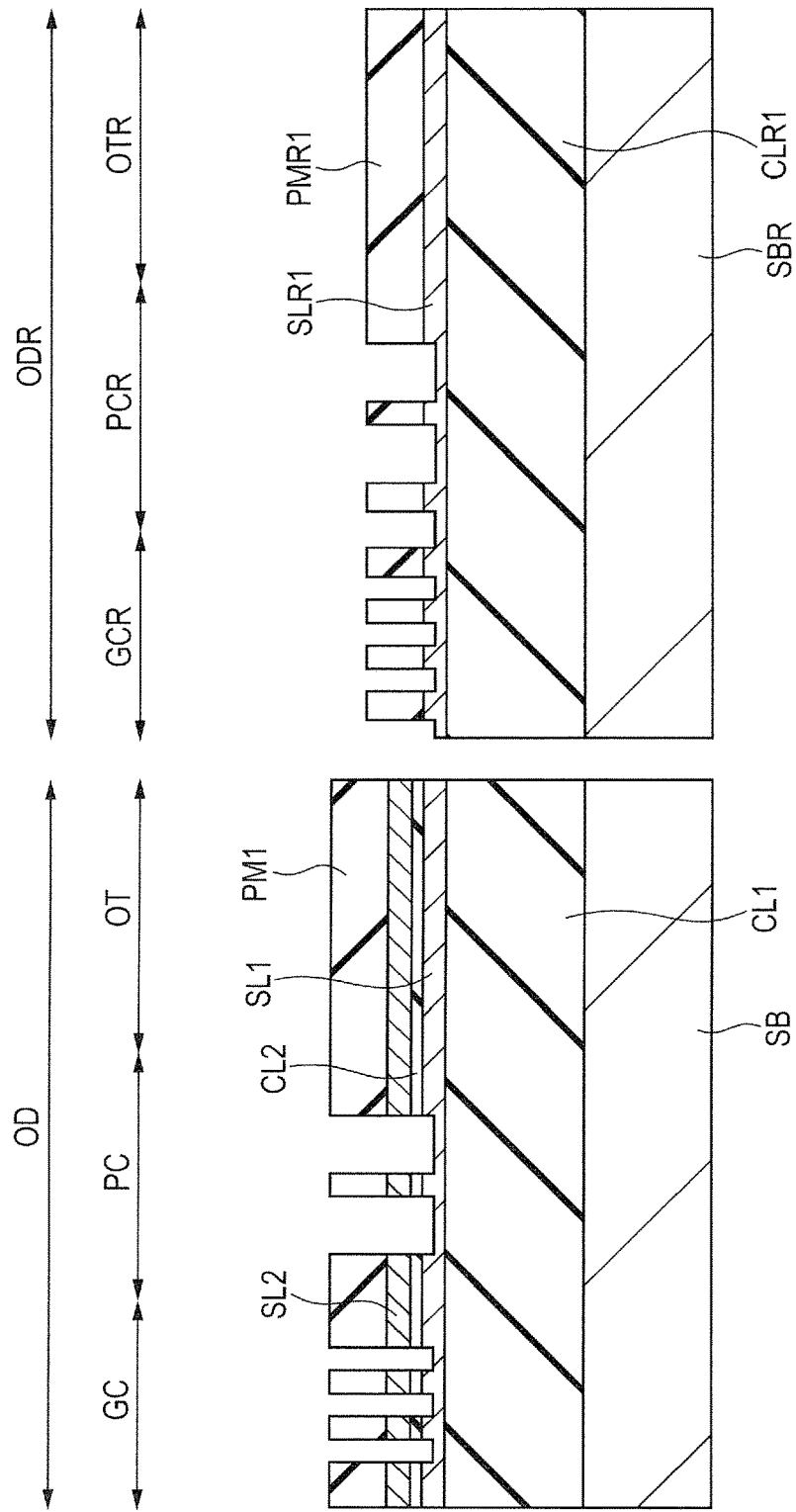
FIG. 6 includes a fragmentary cross-sectional view of the optical device of the embodiment during a manufacturing step thereof following that of FIG. 4 and a fragmentary cross-sectional view of the optical device of Comparative Example during a manufacturing step thereof following that of FIG. 4.
Figure 7:
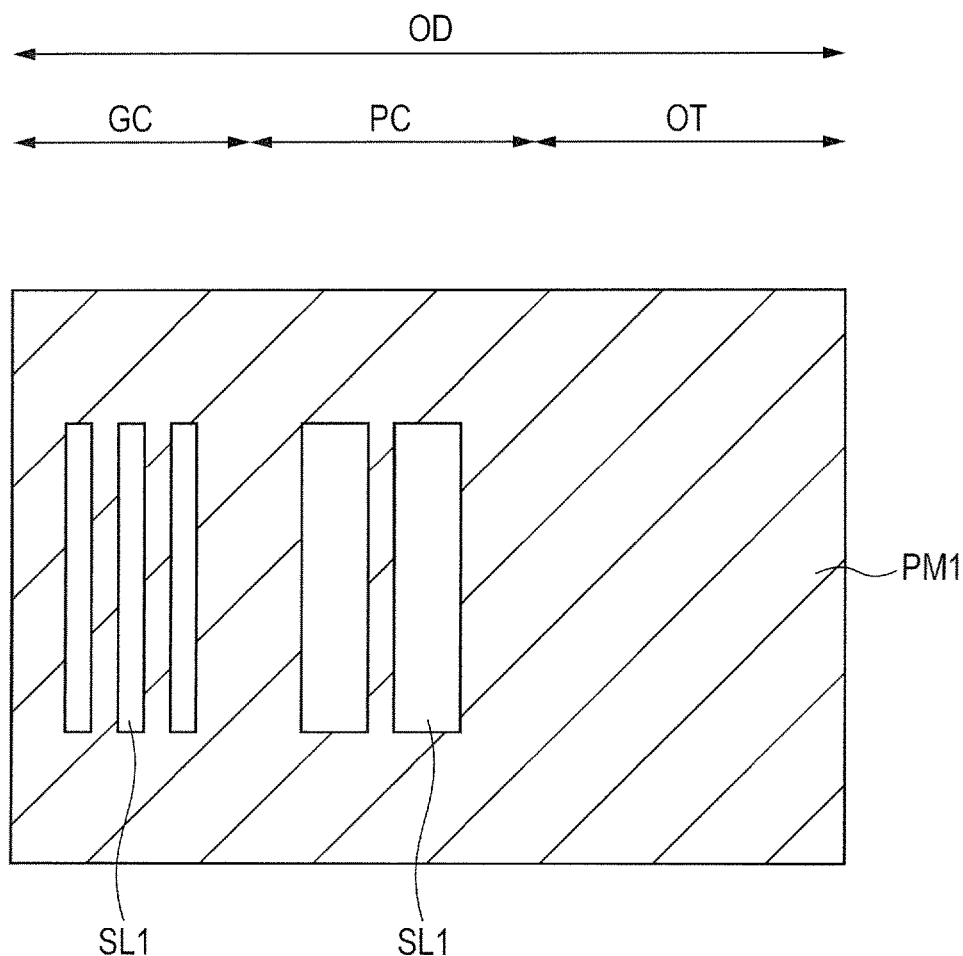
FIG. 7 is a fragmentary plan view of the optical device of the embodiment shown in FIG. 6.

Next, as shown in FIGS. 6 and 7, in the optical device OD, the second semiconductor layer SL2, the second insulating layer CL2, and the first semiconductor layer SL1 are processed successively by etching, with the first resist mask PM1 as an etching mask. At this time, the first semiconductor layer SL1 is processed by half etching into a first semiconductor layer SL1 having a rib structure.

In the comparative optical device ODR, the first semiconductor layer SLR1 is processed by half etching with the first resist mask PMR1 as an etching mask to obtain a first semiconductor layer SLR1 having a rib structure.

Figure 8:
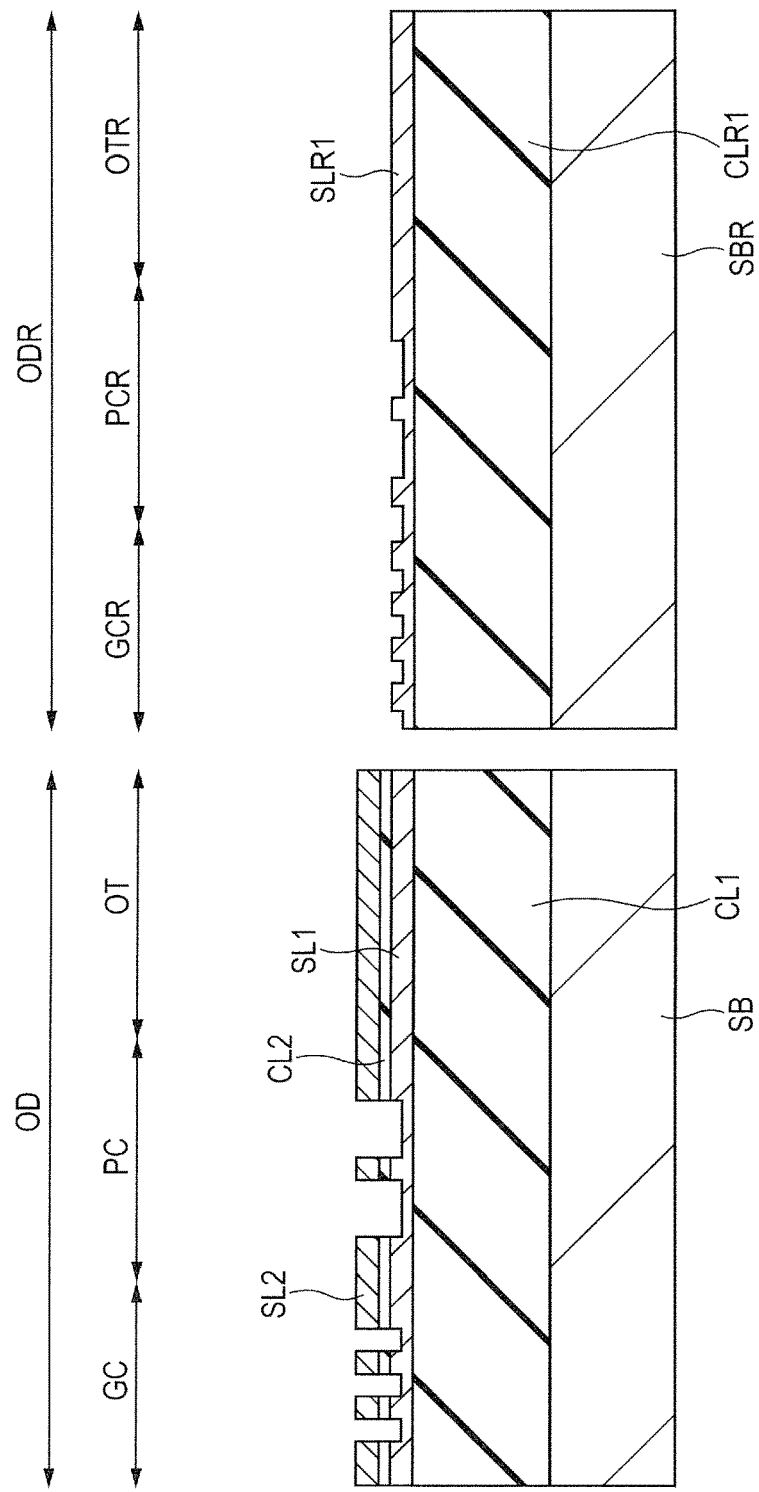
FIG. 8 includes a fragmentary cross-sectional view of the optical device of the embodiment during a manufacturing step thereof following that of FIG. 6 and a fragmentary cross-sectional view of the optical device of Comparative Example during a manufacturing step thereof following that of FIG. 6.
Figure 9:
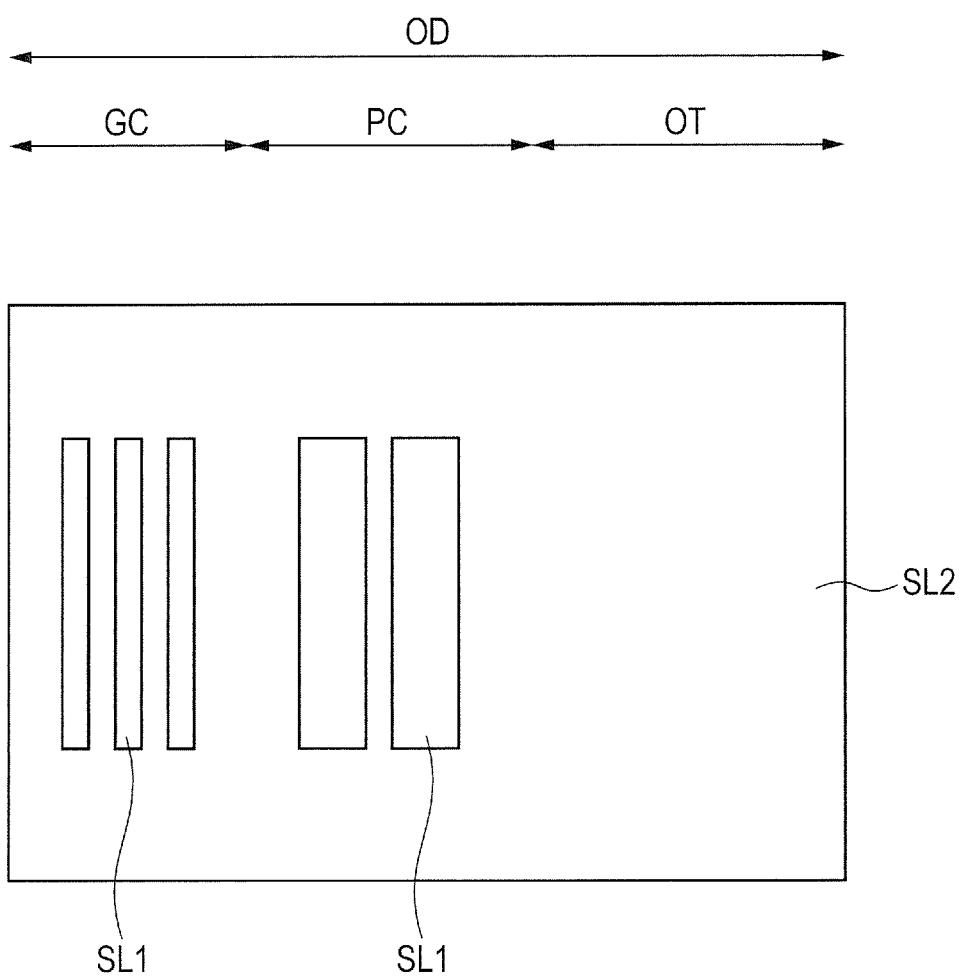
FIG. 9 is a fragmentary plan view of the optical device of the embodiment shown in FIG. 8.

Next, as shown in FIGS. 8 and 9, in the optical device OD and the comparative optical device ODR, oxygen ($O_2$) plasma asking is performed to remove the first resist masks PM1 and PMR1, respectively, followed by RCA cleaning.

Figure 10:
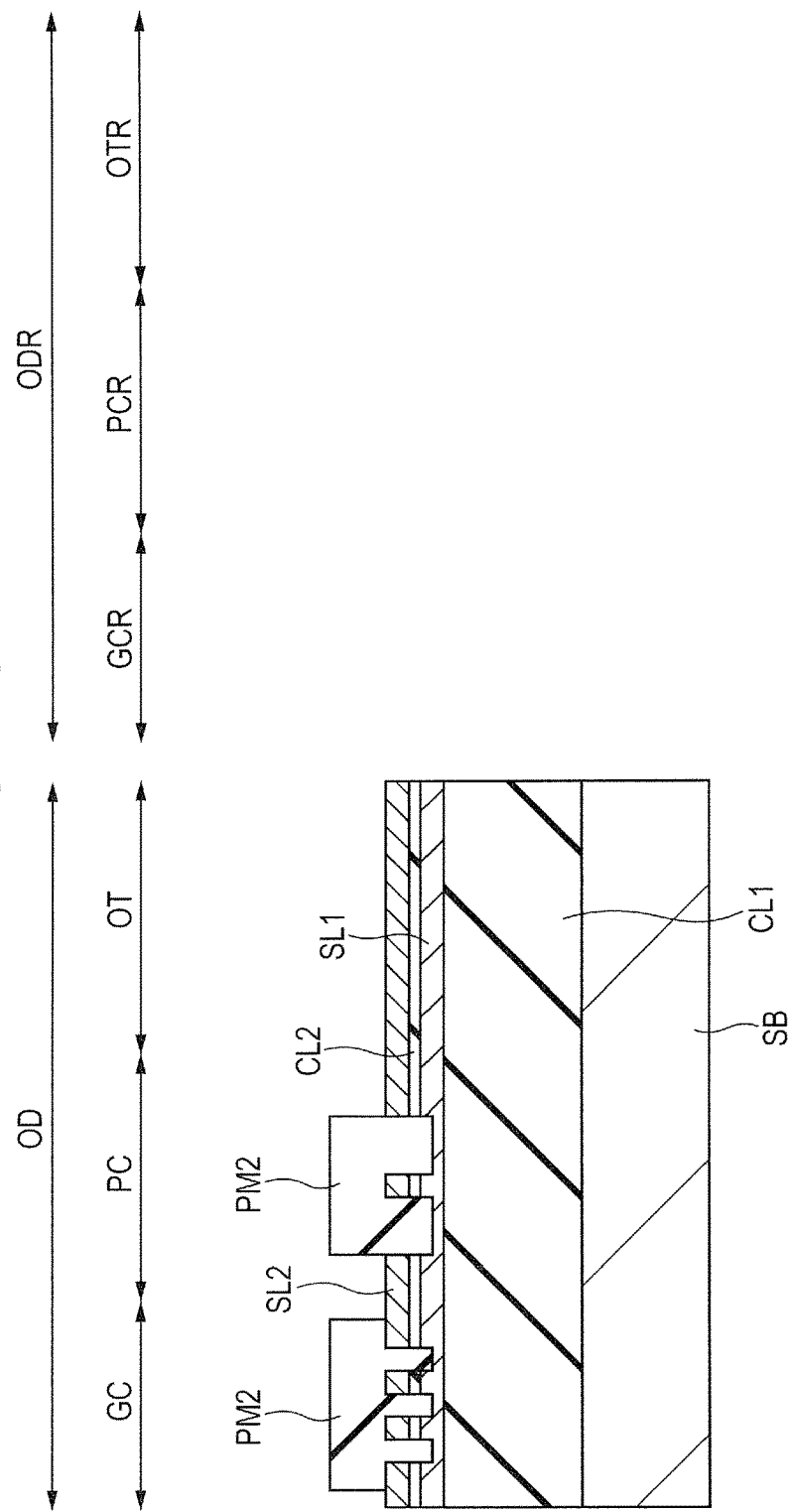
FIG. 10 is a fragmentary cross-sectional view of the optical device of the embodiment during a manufacturing step thereof following that of FIG. 8.
Figure 11:
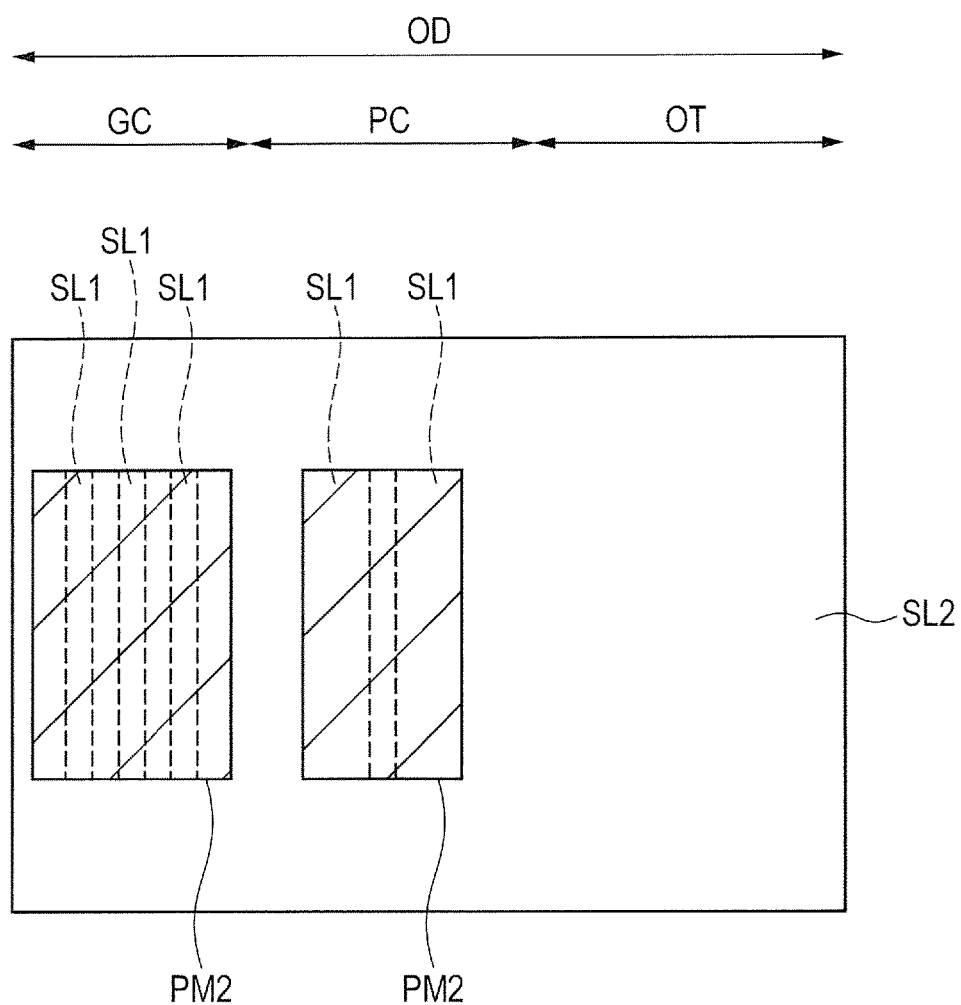
FIG. 11 is a fragmentary plan view of the optical device of the embodiment shown in FIG. 10.

Next, as shown in FIGS. 10 and 11, in the optical device OD, formed is a second resist mask PM2 for removing an unnecessary portion of the second semiconductor layer SL2 and the second insulating layer CL2 around a region in which the grating coupler GC is to be formed and a region in which the MOS optical modulator PC is to be formed.

FIG. 10 shows a monolayer resist mask as an example, but a multilayer resist mask may be used. The second resist mask PM2 is formed, for example, by applying a photoresist onto the upper surface of the second semiconductor layer SL2, subjecting it to liquid immersion exposure using an ArF excimer laser (wavelength: 193 nm), carrying out development treatment, and thereby patterning the photoresist.

Figure 12:
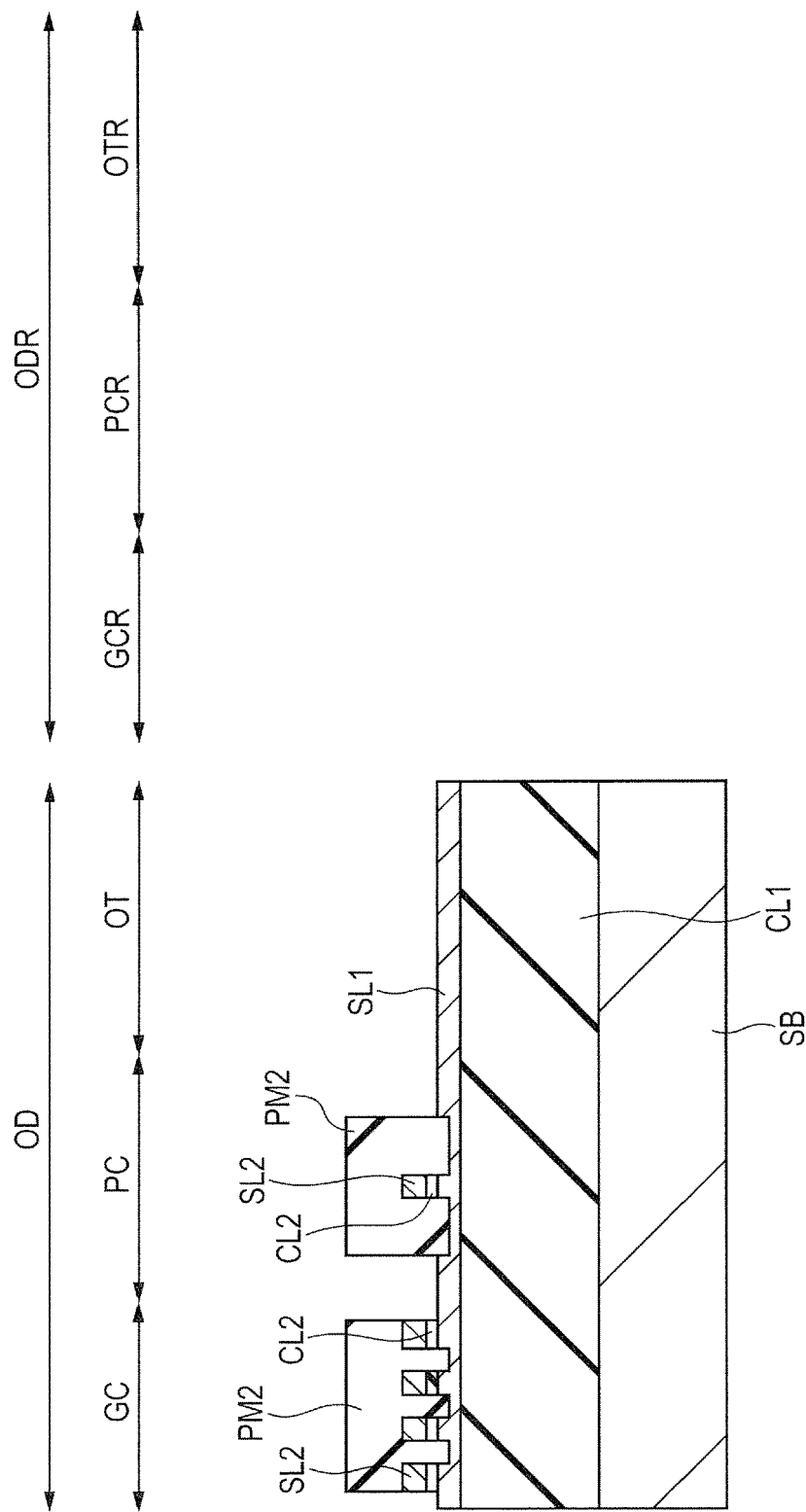
FIG. 12 is a fragmentary cross-sectional view of the optical device of the embodiment during a manufacturing step thereof following that of FIG. 10.
Figure 13:
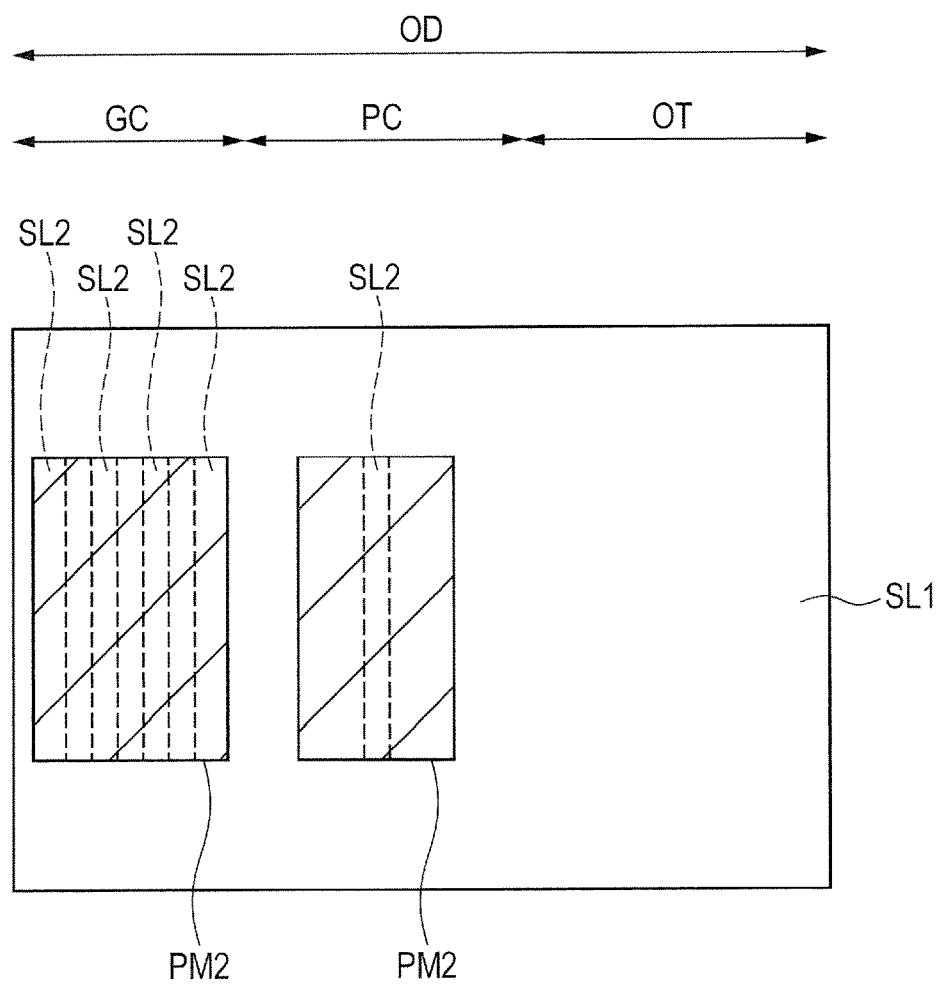
FIG. 13 is a fragmentary plan view of the optical device of the embodiment shown in FIG. 12.

Next, as shown in FIGS. 12 and 13, in the optical device OD, with a second resist mask PM2 as an etching mask, the second semiconductor layer SL2 is processed by full etching. At this time, the second insulating layer CL2 functions as an etching stopper. With the second resist mask PM2 as an etching mask, the second insulating layer CL2 is also processed. At this time, the second insulating layer CL2 is processed preferably by wet etching to prevent the first semiconductor layer SL1 from being damaged.

Figure 14:
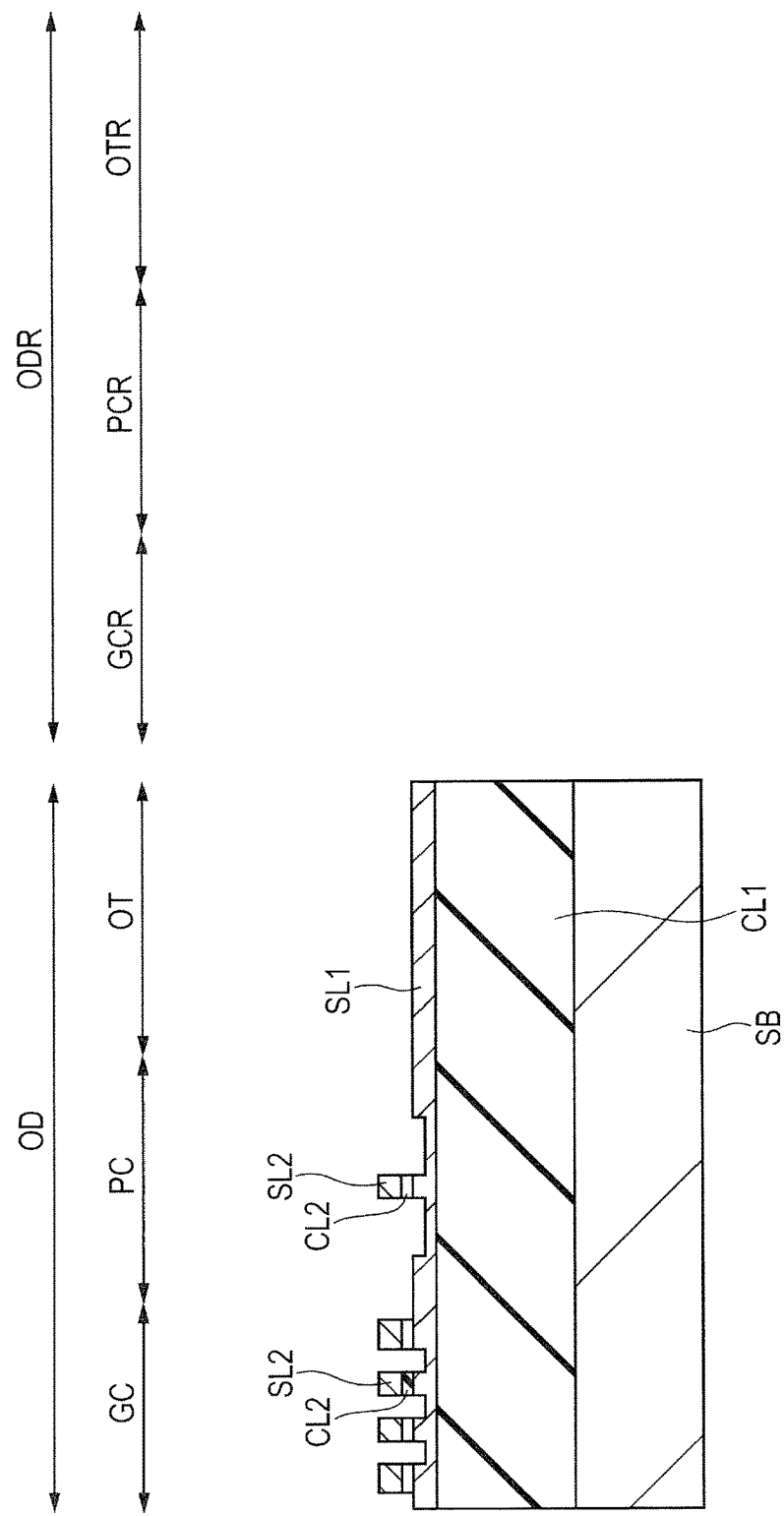
FIG. 14 is a fragmentary cross-sectional view of the optical device of the embodiment during a manufacturing step thereof following that of FIG. 12.
Figure 15:
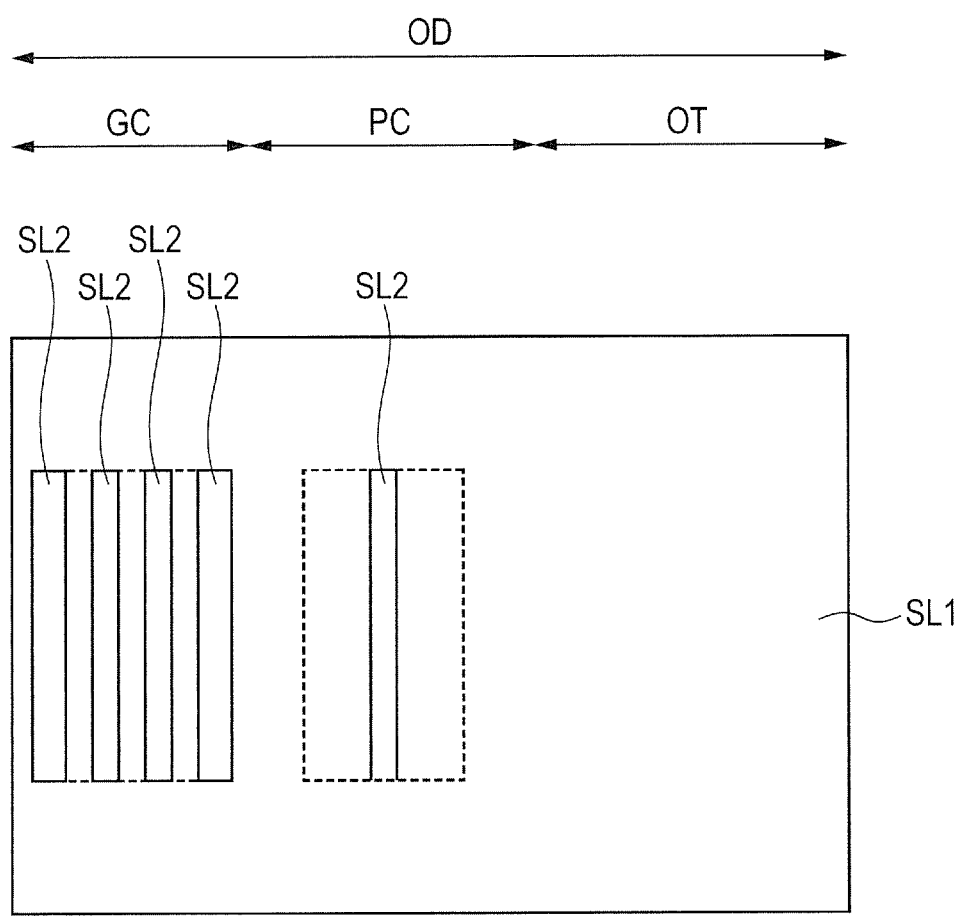
FIG. 15 is a fragmentary plan view of the optical device of the embodiment shown in FIG. 14.

Next, as shown in FIGS. 14 and 15, in the optical device OD, the second resist mask PM2 is removed by oxygen ($O_2$) plasma asking, followed by RCA cleaning.

Figure 16:
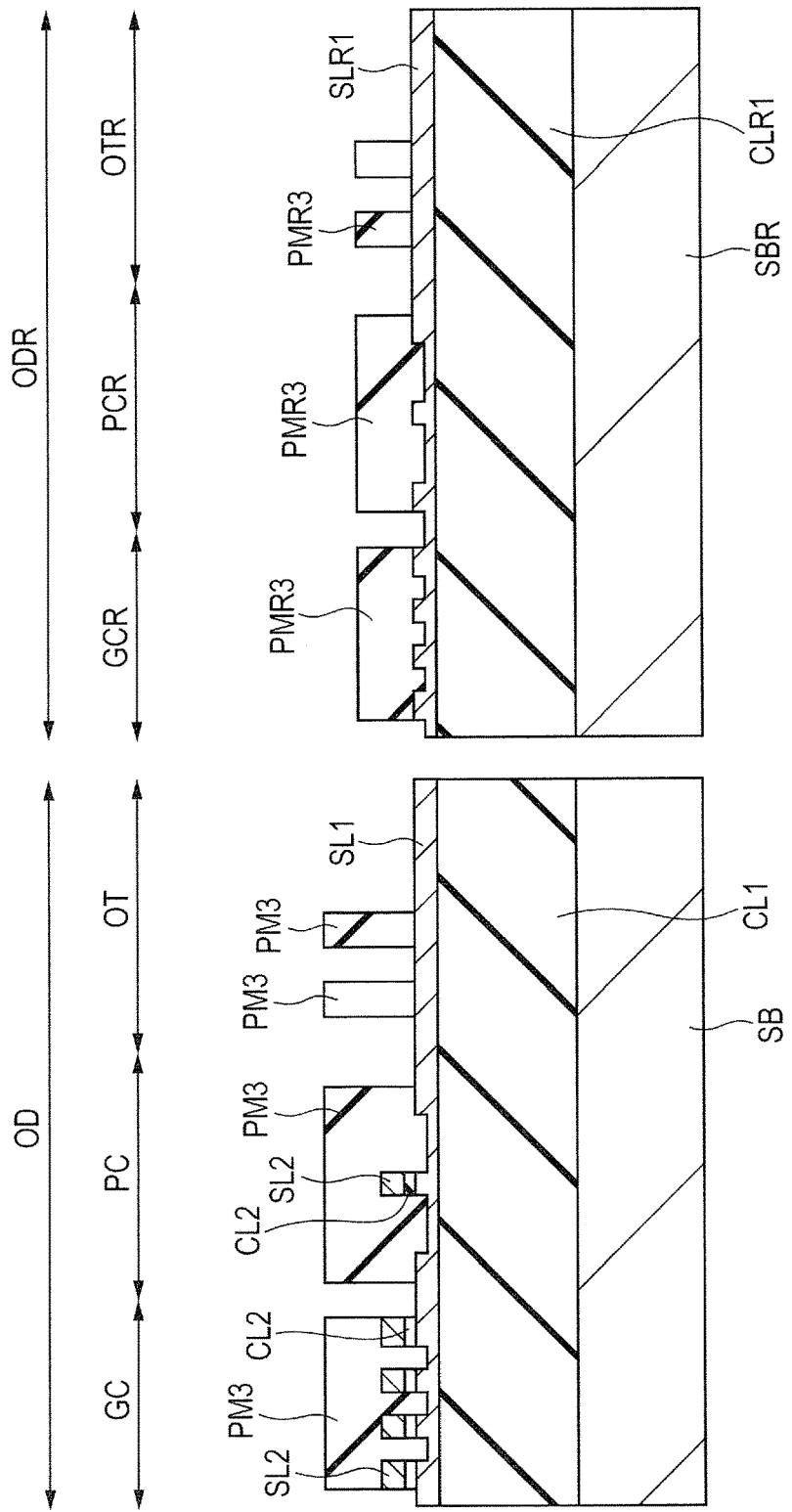
FIG. 16 includes a fragmentary cross-sectional view of the optical device of the embodiment during a manufacturing step thereof following that of FIG. 14 and a fragmentary cross-sectional view of the optical device of Comparative Example during a manufacturing step thereof following that of FIG. 8.
Figure 17:
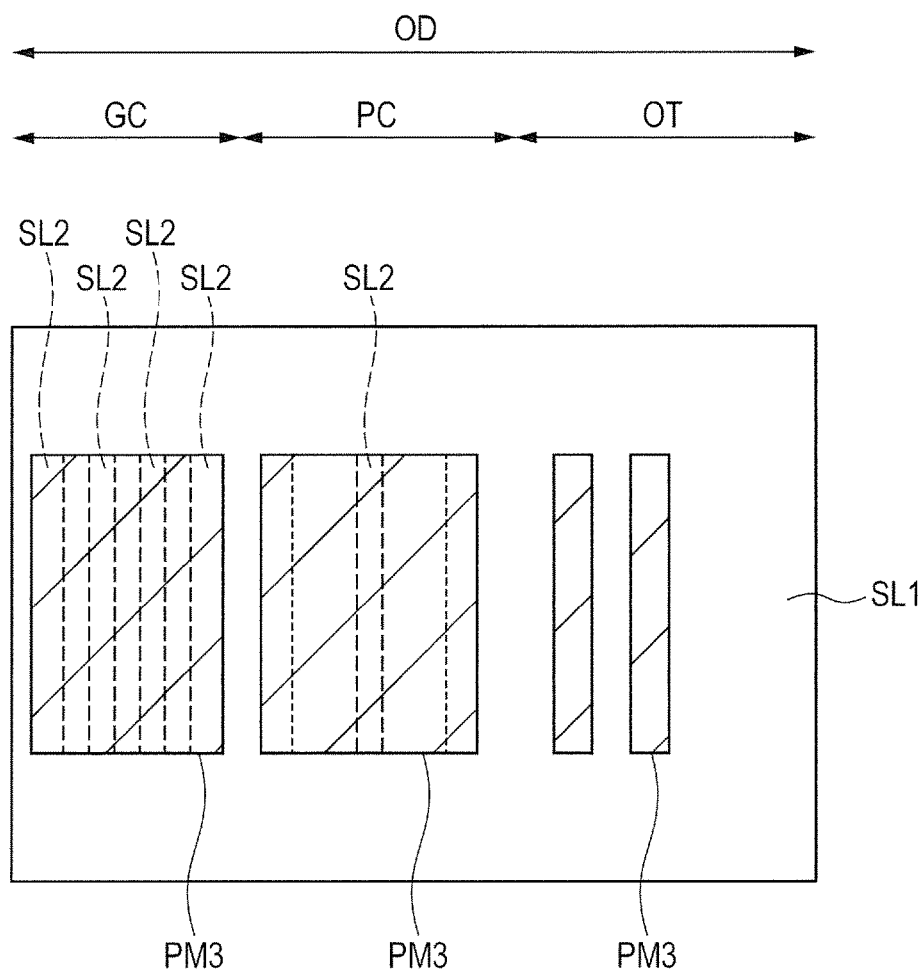
FIG. 17 is a fragmentary plan view of the optical device of the embodiment shown in FIG. 16.

Next, as shown in FIGS. 16 and 17, in the optical device OD, the first semiconductor layer SL1 is processed to form a third resist mask PM3 for separating the optical signal line OT, the grating coupler GC, and the MOS optical modulator PC from one another.

In the comparative optical device ODR, the first semiconductor layer SLR1 is processed to form a third resist mask PMR3 for separating the optical signal line OTR, the grating coupler GCR, and the MOS optical modulator PCR from one another. In plan view, the third resist mask PM3 and the third resist mask PMR3 have almost the same pattern.

A monolayer resist mask is illustrated in FIG. 16, but a multilayer resist mask may also be used. The third resist mask PM3 to be used in the optical device OD is formed, for example, by applying a photoresist onto the upper surface of the first semiconductor layer SL1 and the second semiconductor layer SL2, subjecting it to liquid immersion exposure using an ArF excimer laser (wavelength: 193 nm), carrying out development treatment, and thereby patterning the photoresist. Similarly, the third resist mask PMR3 to be used in the comparative optical device ODR is formed, for example, by applying a photoresist onto the upper surface of the first semiconductor layer SLR1, subjecting it to liquid immersion exposure using an ArF excimer laser (wavelength: 193 nm), carrying out development treatment, and thereby patterning the photoresist.

Figure 18:
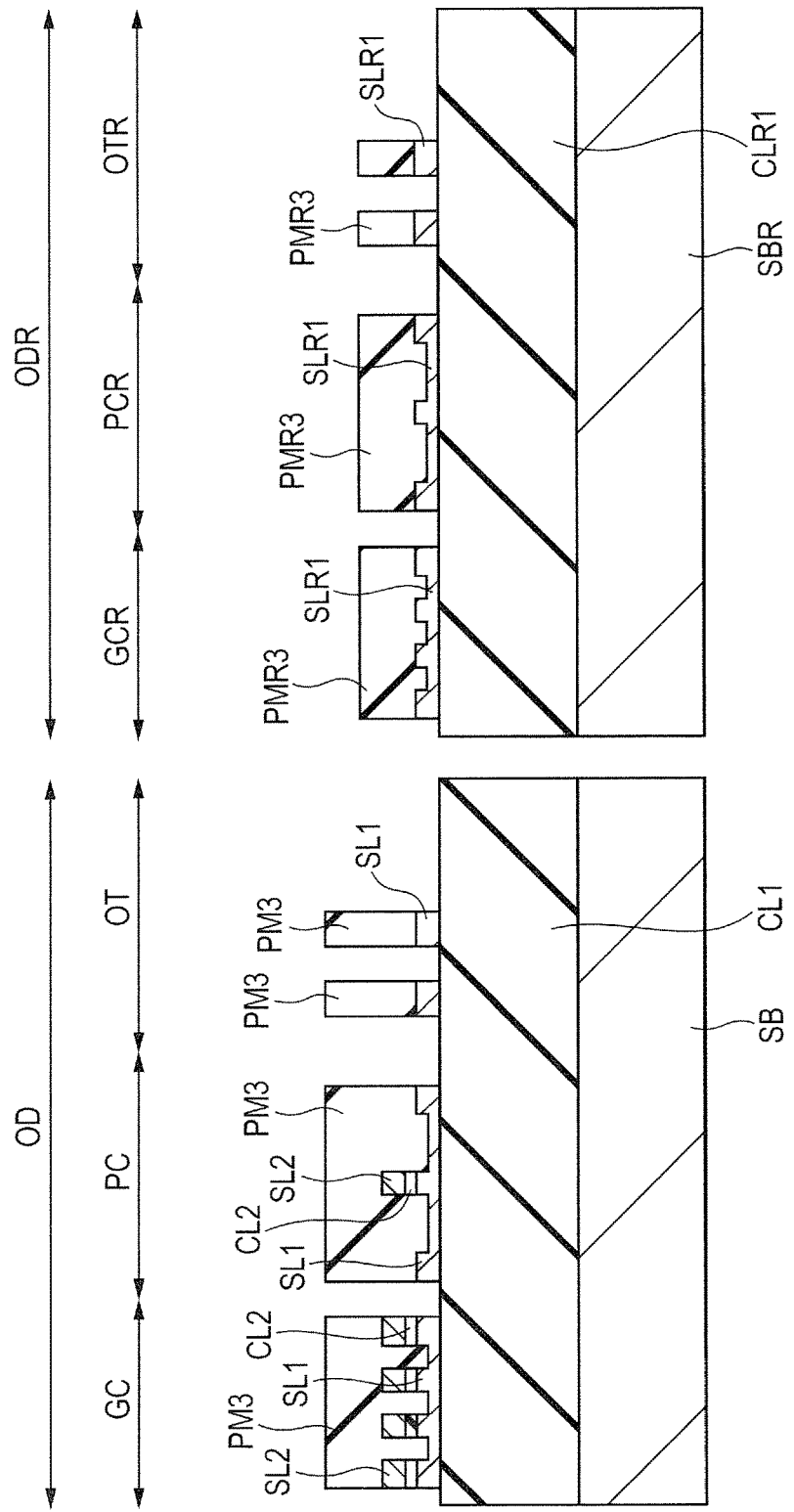
FIG. 18 includes a fragmentary cross-sectional view of the optical device of the embodiment during a manufacturing step thereof following that of FIG. 16 and a fragmentary cross-sectional view of the optical device of Comparative Example during a manufacturing step thereof following that of FIG. 16.
Figure 19:
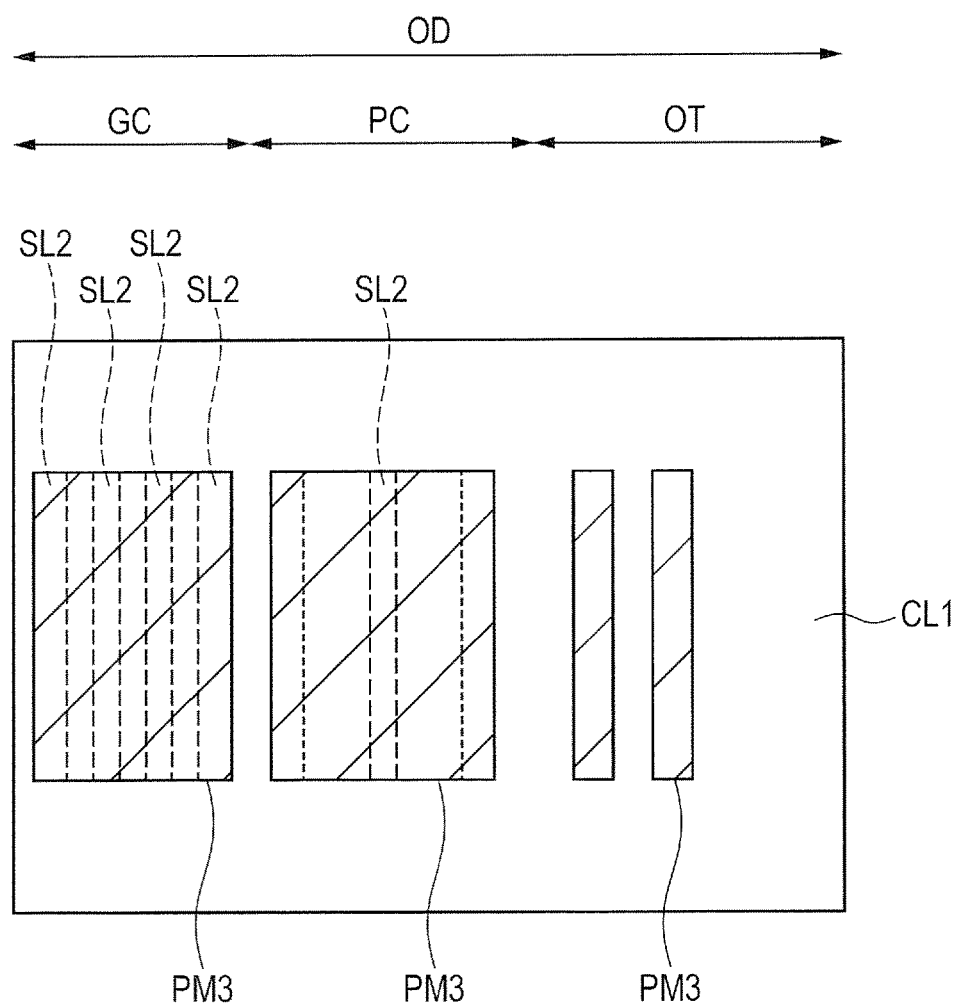
FIG. 19 is a fragmentary plan view of the optical device of the embodiment shown in FIG. 18.

Next, as shown in FIGS. 18 and 19, in the optical device OD, the first semiconductor layer SL1 is processed by full etching with the third resist mask PM3 as an etching mask.

In the comparative optical device ODR, the first semiconductor layer SLR1 is processed by full etching with the third resist mask PMR3 as an etching mask.

Figure 20:
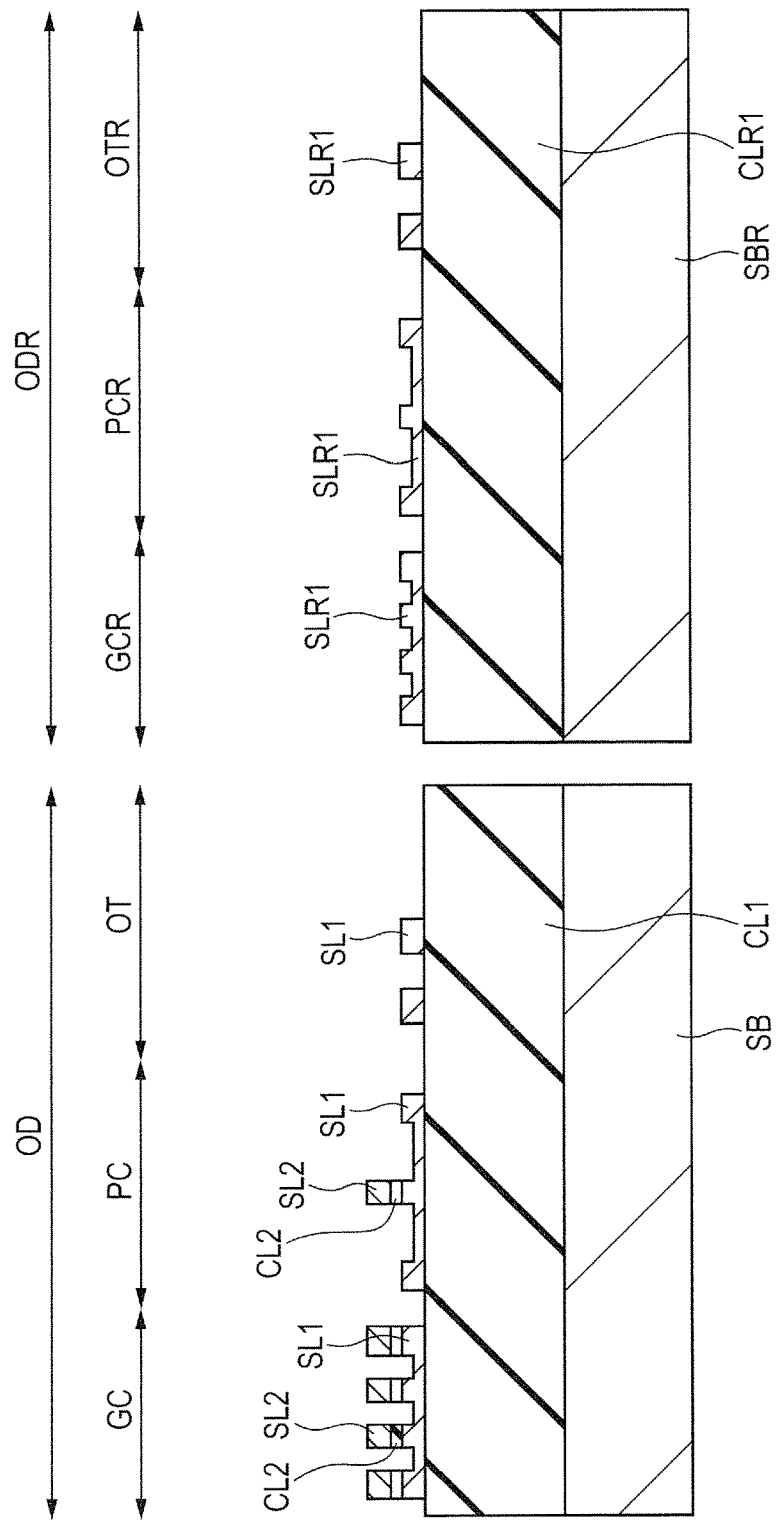
FIG. 20 includes a fragmentary cross-sectional view of the optical device of the embodiment during a manufacturing step thereof following that of FIG. 18 and a fragmentary cross-sectional view of the optical device of Comparative Example during a manufacturing step thereof following that of FIG. 18.
Figure 21:
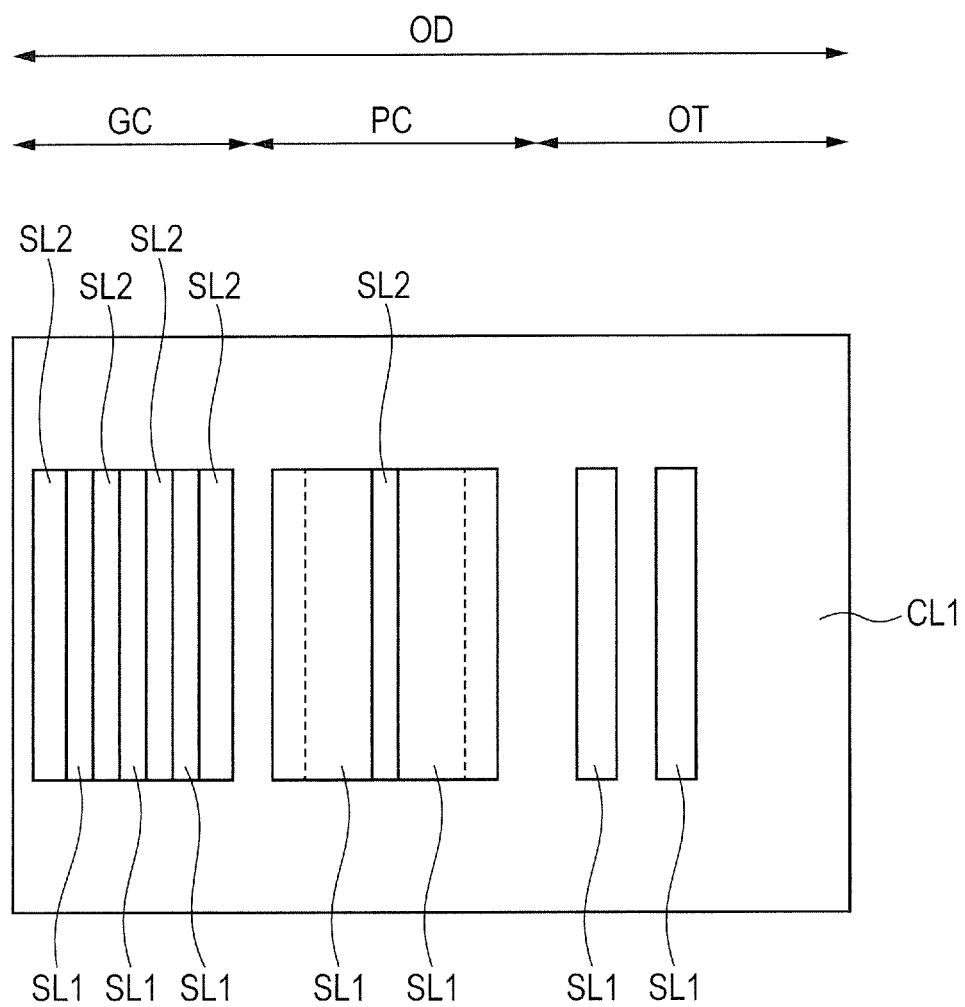
FIG. 21 is a fragmentary plan view of the optical device of the embodiment shown in FIG. 20.

Next, as shown in FIGS. 20 and 21, in the optical device OD and the comparative optical device ODR, the third resist masks PM3 and PMR3 are removed by oxygen ($O_2$) plasma asking, respectively, followed by RCA cleaning. Then, wet etching treatment is performed to remove, in the optical device OD, a natural oxide film and the like formed on the surface of the first semiconductor layer SL1 and the second semiconductor layer SL2. Further, in the comparative optical device ODR, a natural oxide film and the like formed on the surface of the first semiconductor layer SLR1 is removed.

By the steps so far described, in the optical device OD, the respective structures of the optical signal line OT, the grating coupler GC, and the MOS optical modulator PC are substantially completed.

The optical signal line OT is formed of the first semiconductor layer SL1 extending in the optical waveguide direction and is rectangular in its cross-section orthogonal to the optical waveguide direction.

The grating coupler GC has a plurality of projections formed of the first semiconductor layer SL1, the second insulating layer CL2, and a second semiconductor layer SL2 and separated from each other in the optical waveguide direction. More specifically, the first semiconductor layer SL1 has a plurality of projections separated from each other in the optical waveguide direction and a slab portion formed between any two of the projections adjacent to each other and formed integrally with these projections. It has, on the projections thereof, the second semiconductor layer SL2 via the second insulating layer CL2.

The MOS optical modulator PC has a projection which is formed of the first semiconductor layer SL1 comprised of a p type semiconductor, the second insulating layer CL2, and the second semiconductor layer SL2 comprised of an n type semiconductor, extends along the optical waveguide direction, and serves as a light propagating core layer. More specifically, the first semiconductor layer SL1 has the projection extending along the optical waveguide direction and slab portions formed on both sides of the projection, respectively, and formed integrally with the projection. The projection has thereon the second semiconductor layer SL2 via the second insulating layer CL2.

By the steps so far described above, the respective structures of the optical signal line OTR and the grating coupler GCR of the comparative optical device ODR are substantially completed.

The optical signal line OTR is formed of the first semiconductor layer SLR1 extending in the optical waveguide direction and is rectangular in the cross-section orthogonal to the optical waveguide direction.

The grating coupler GCR is formed of the first semiconductor layer SLR1 and has a plurality of projections separated from each other in the optical waveguide direction.

The MOS optical modulator PCR has however not yet been completed and it requires the following manufacturing steps further.

Figure 22:
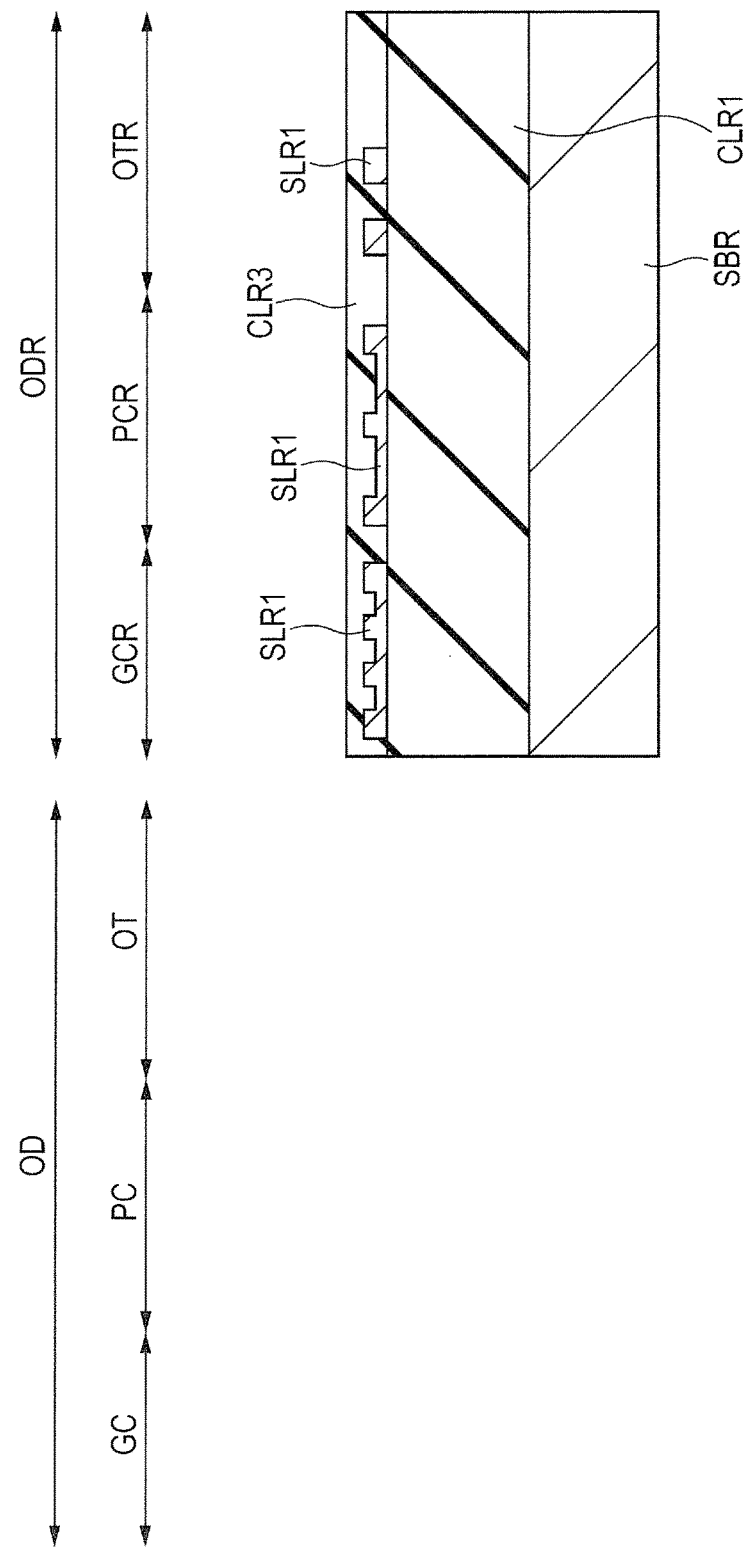
FIG. 22 is a fragmentary cross-sectional view of the optical device of Comparative Example during a manufacturing step thereof following that of FIG. 20.

Next, as shown in FIG. 22, in the comparative optical device ODR, a third insulating layer CLR3 is formed on the first insulating layer CLR1 to cover the first semiconductor layer SLR1.

Figure 23:
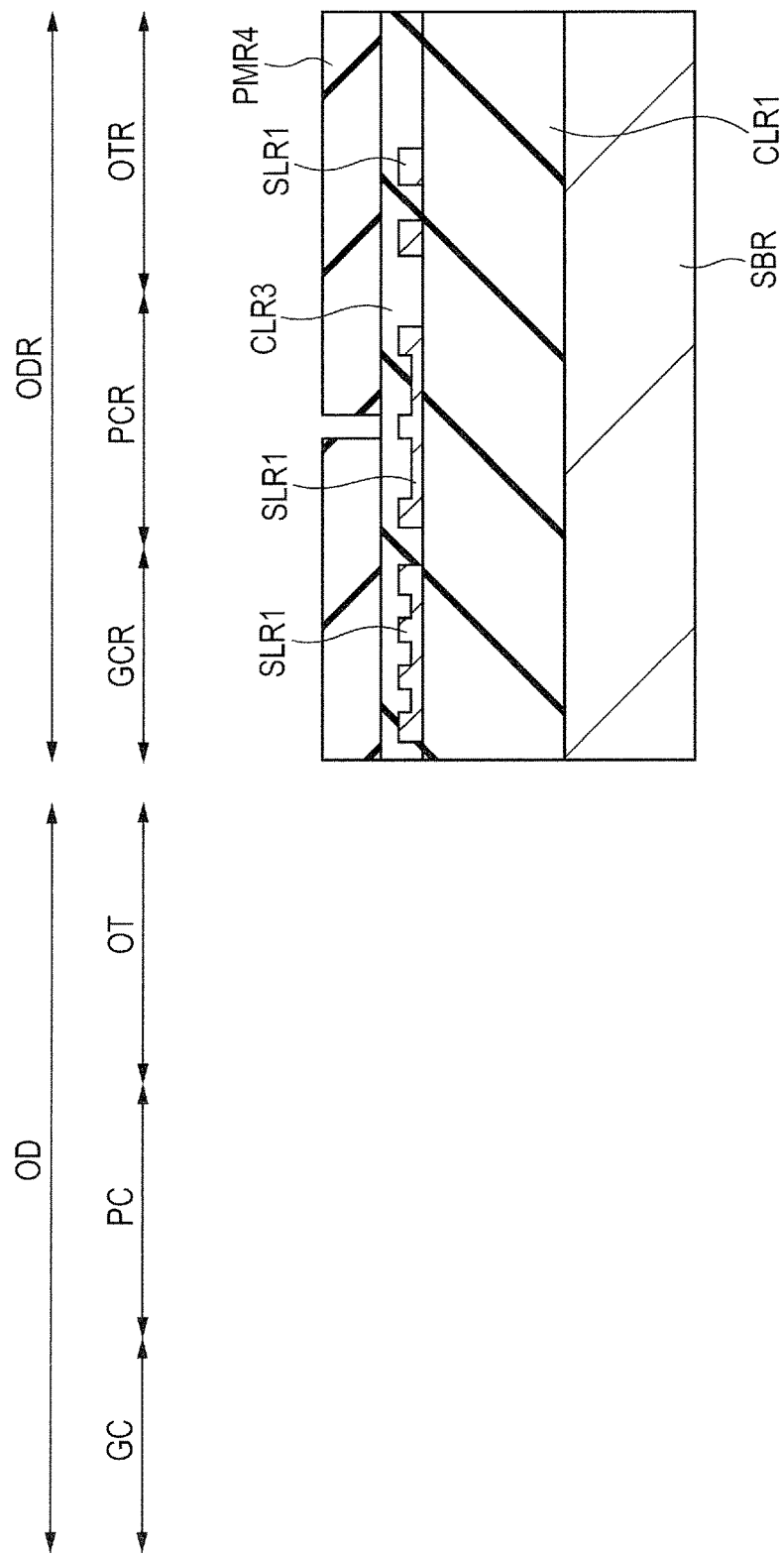
FIG. 23 is a fragmentary cross-sectional view of the optical device of Comparative Example during a manufacturing step thereof following that of FIG. 22.

Next, as shown in FIG. 23, in the comparative optical device ODR, a fourth resist mask PMR4 is formed to have an opening over the projection of the first semiconductor layer SLR1 which will be a core layer of the MOS optical modulator PCR.

FIG. 23 shows a monolayer resist mask as an example, but a multilayer resist mask may be used. The fourth resist mask PMR4 is formed, for example, by applying a photoresist onto the upper surface of the third insulating layer CLR3, subjecting it to liquid immersion exposure using an ArF excimer laser (wavelength: 193 nm), carrying out development treatment, and thereby patterning the photoresist.

Figure 24:
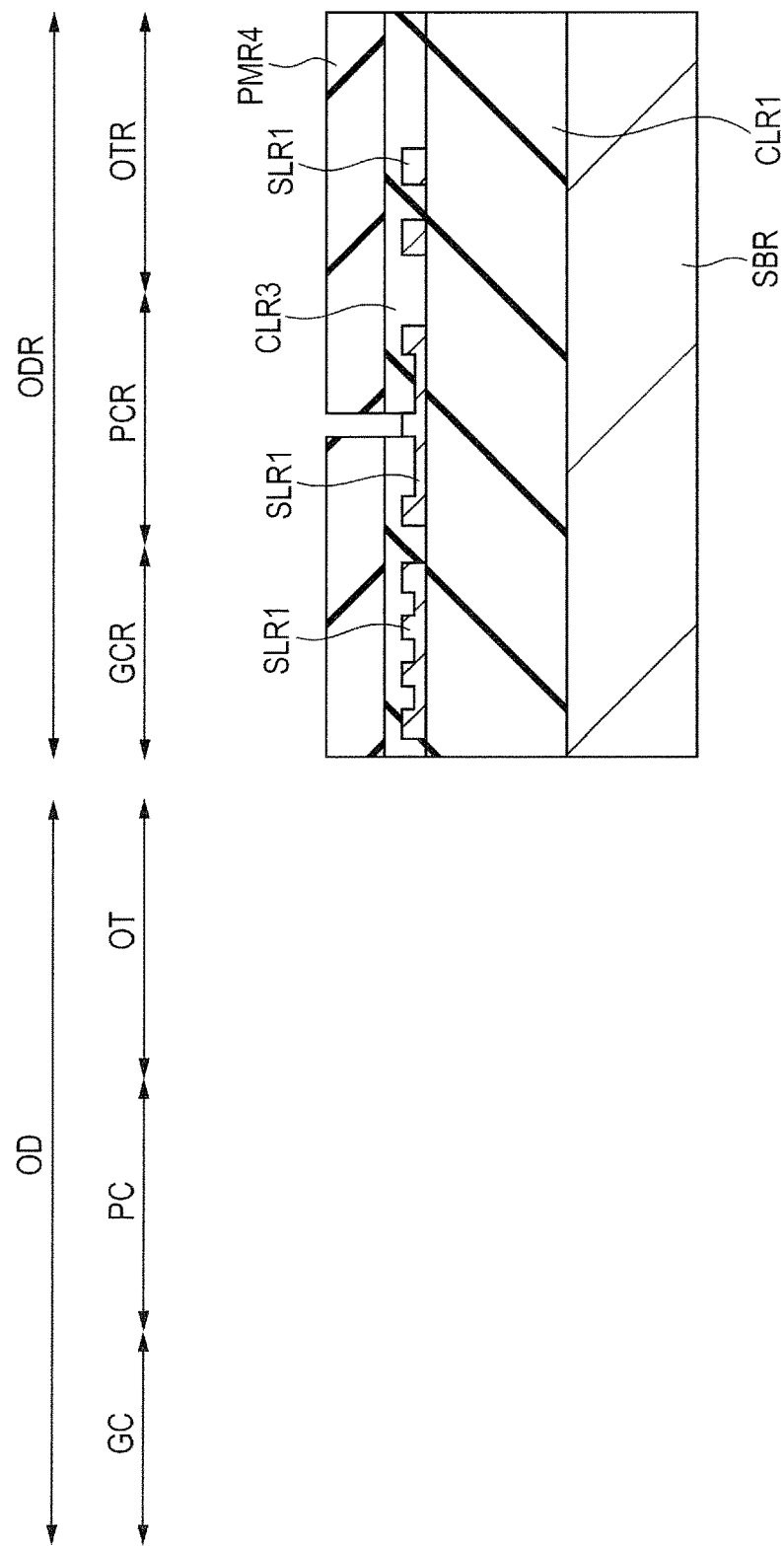
FIG. 24 is a fragmentary cross-sectional view of the optical device of Comparative Example during a manufacturing step thereof following that of FIG. 23.

Next, as shown in FIG. 24, in the comparative optical device ODR, the third insulating layer CLR3 on the projection of the first semiconductor layer SLR1 which will be a core layer of the MOS optical modulator PCR is removed with the fourth resist mask PMR4 as an etching mask.

Figure 25:
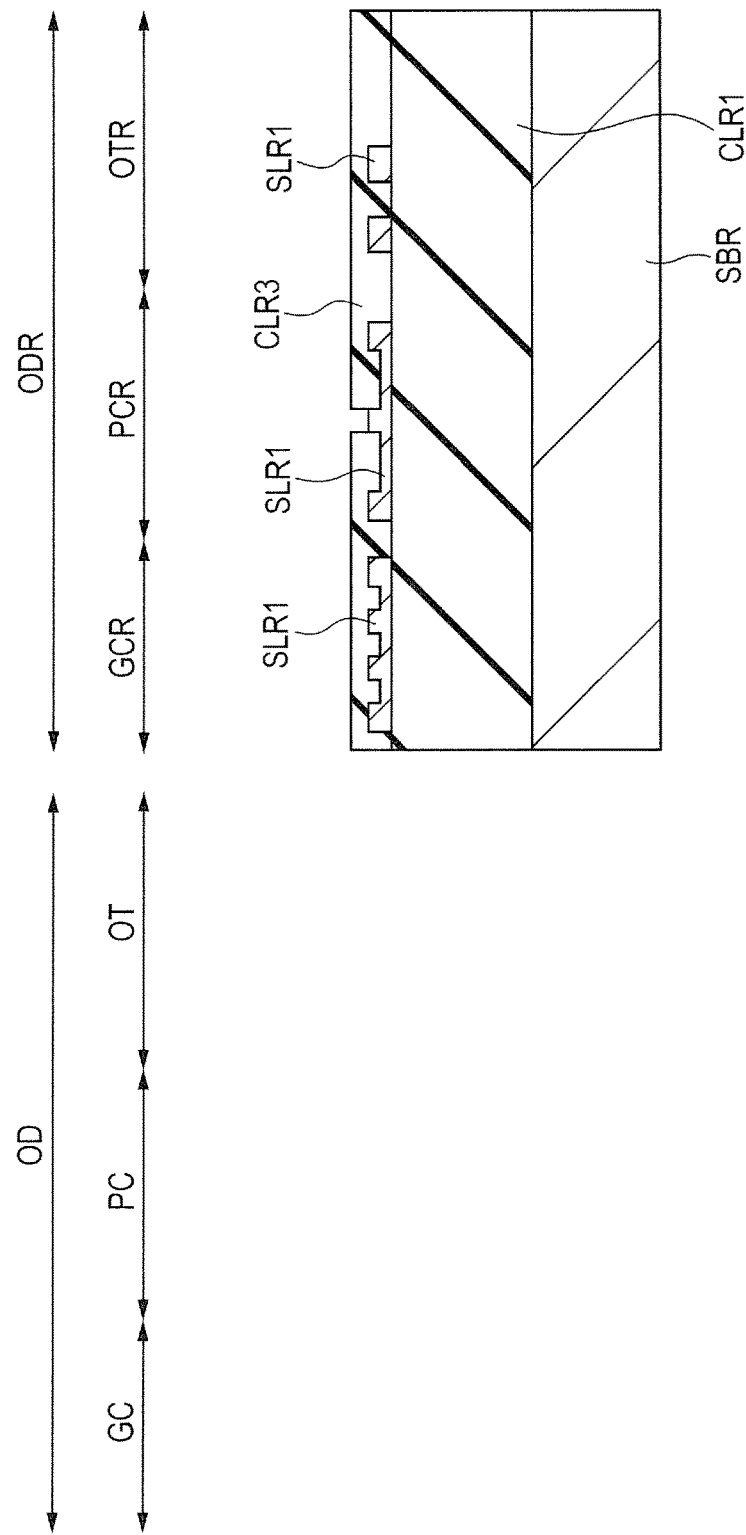
FIG. 25 is a fragmentary cross-sectional view of the optical device of Comparative Example during a manufacturing step thereof following that of FIG. 24.

Next, as shown in FIG. 25, in the comparative optical device ODR, the fourth resist mask PMR4 is removed by oxygen ($O_2$) plasma asking, followed by RCA cleaning. Then, wet etching treatment is performed to remove a natural oxide film and the like formed on the surface of the projection of the first semiconductor layer SLR1 exposed from the third insulating layer CLR3.

Figure 26:
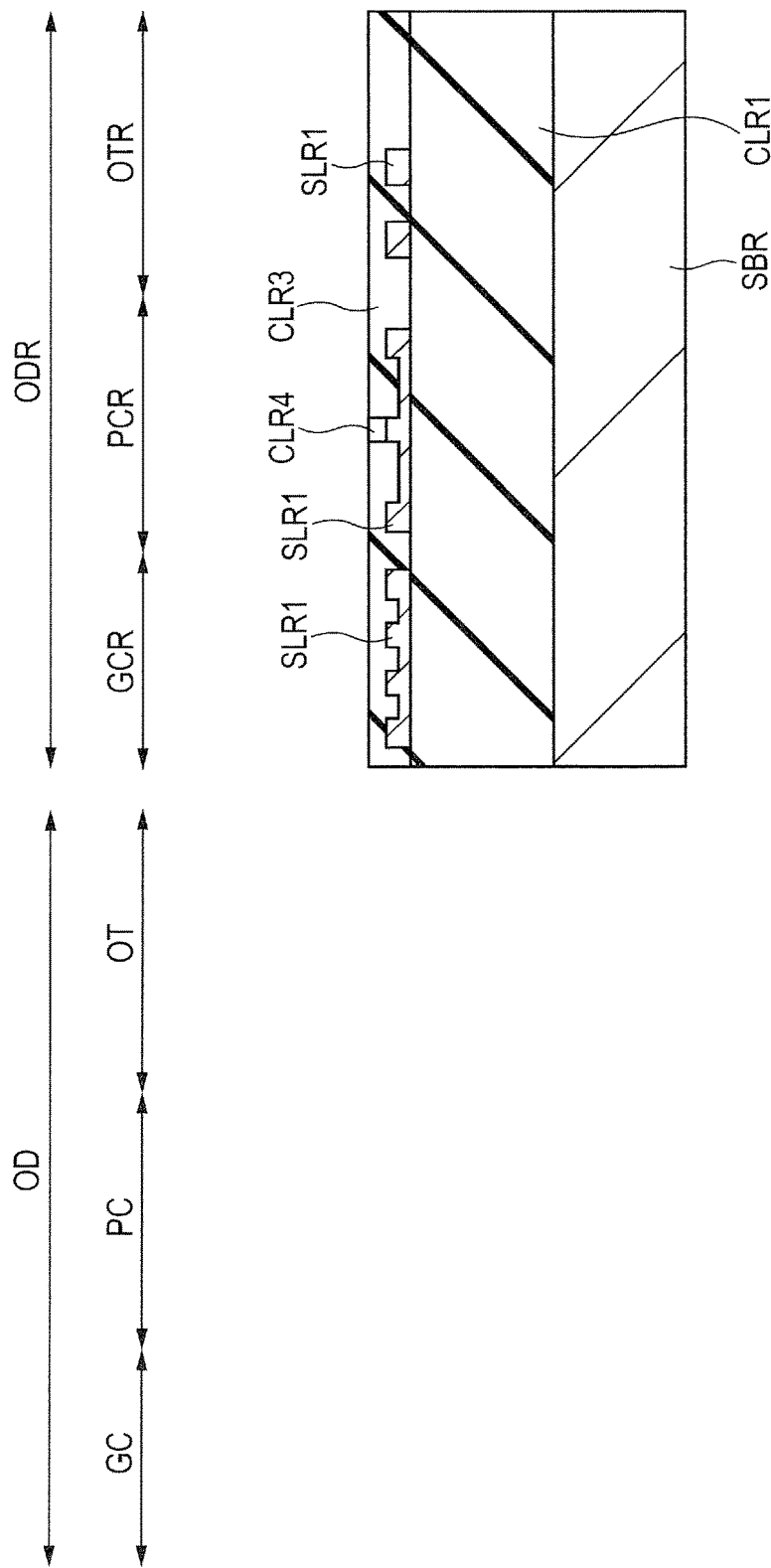
FIG. 26 is a fragmentary cross-sectional view of the optical device of Comparative Example during a manufacturing step thereof following that of FIG. 25.

Next, as shown in FIG. 26, in the comparative optical device ODR, a fourth insulating layer CLR4 is formed on the surface of the projection of the first semiconductor layer SLR1 exposed from the third insulating layer CLR3 by thermal oxidation. The fourth insulating layer CLR4 is comprised of, for example, silicon oxide ($SiO_2$) and it has a thickness of, for example, about 0.005 μm. Thermal oxidation is performed, for example, under the following conditions: heat treatment temperature of about 850° C., thermal treatment atmosphere of oxygen ($O_2$), and heat treatment time of from about 3 minutes to 6 minutes.

In the comparative optical device ODR, when misalignment occurs, in the step described referring to FIG. 23, between the fourth resist mask PMR4 and the projection of the first semiconductor layer SLR1 which will be a core layer of the MOS optical modulator PCR, the fourth insulating layer CLR4 is inevitably formed on the upper surface and side surface of the projection of the first semiconductor layer SLR1 which will be a core layer of the MOS optical modulator PCR. Then, there is a possibility of variation in the characteristics of the MOS optical modulator PCR.

In the optical device OD, the second semiconductor layer SL2, the second insulating layer CL2, and the first semiconductor layer SL1 are processed successively using the first resist mask PM1 in the step described referring to FIG. 6. Since the second insulating layer CL2 is formed only on the upper surface of the projection of the first semiconductor layer SL1 which will be a core layer of the MOS optical modulator PC, the resulting MOS optical modulator PC is free from variation in its characteristics which will otherwise be caused by the misalignment of the resist mask.

Figure 27:
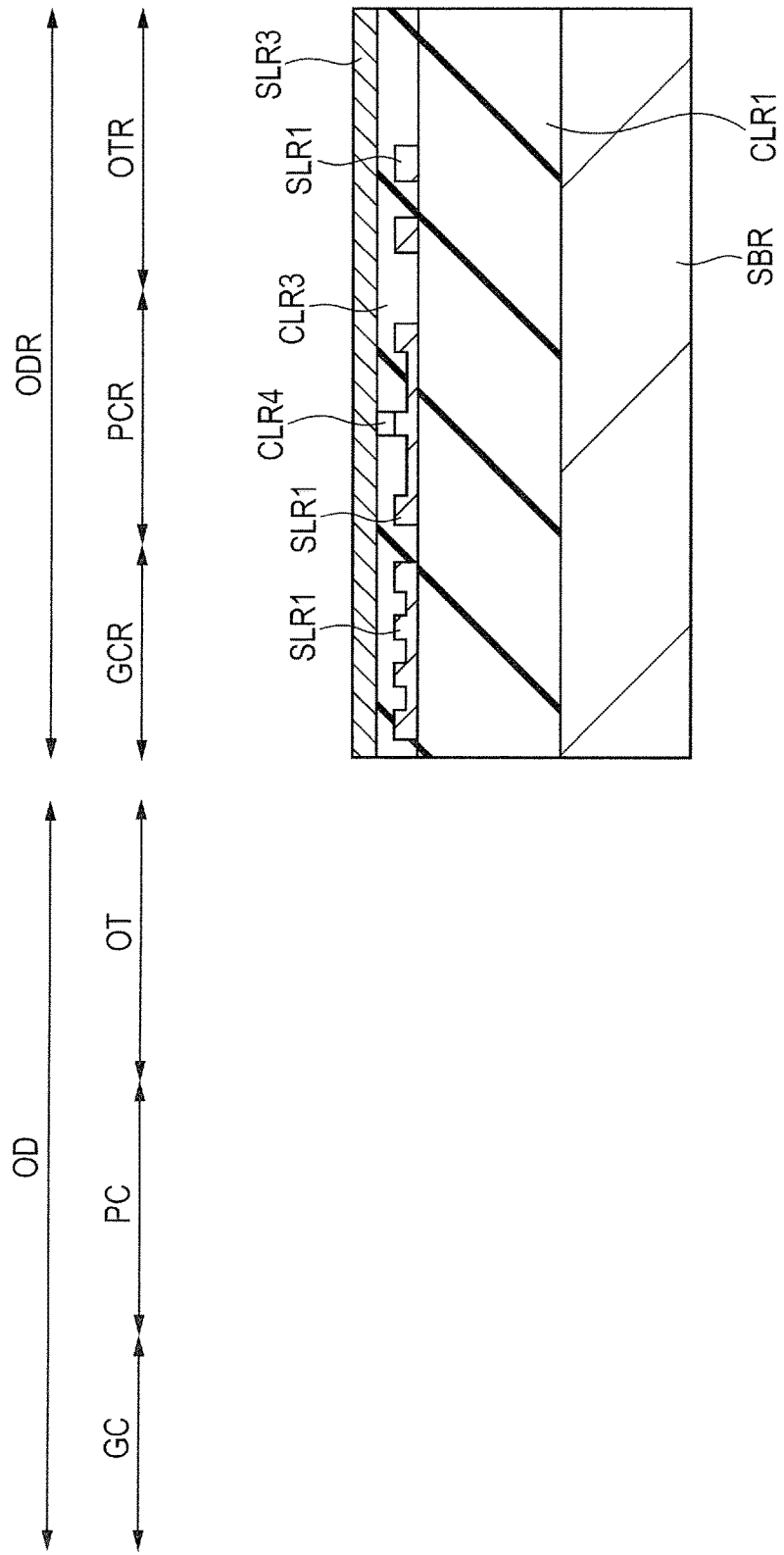
FIG. 27 is a fragmentary cross-sectional view of the optical device of Comparative Example during a manufacturing step thereof following that of FIG. 26.

Next, as shown in FIG. 27, in the comparative optical device ODR, a third semiconductor layer SLR3 comprised of, for example, polycrystalline silicon (Si) is formed on the third insulating layer CLR3 and the fourth insulating layer CLR4. The third semiconductor layer SLR3 has, for example, an n type conductivity.

Figure 28:
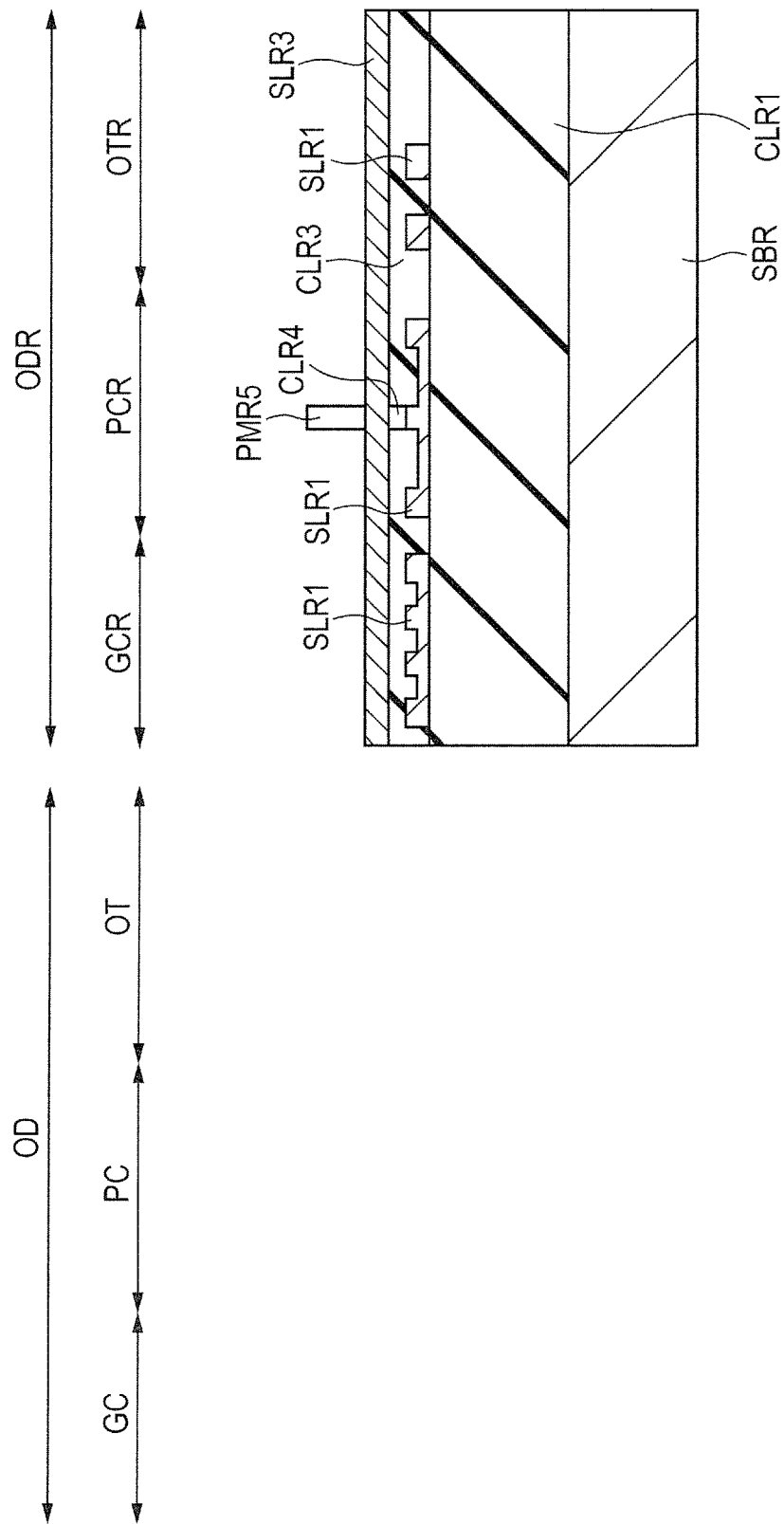
FIG. 28 is a fragmentary cross-sectional view of the optical device of Comparative Example during a manufacturing step thereof following that of FIG. 27.

Next, as shown in FIG. 28, in the comparative optical device ODR, a fifth resist mask PMR5 for processing the third semiconductor layer SLR3 is formed.

In FIG. 28, a monolayer resist mask is shown as an example, but a multilayer resist mask may be used. The fifth resist mask PMR5 is formed, for example, by applying a photoresist onto the upper surface of the third semiconductor layer SLR3, subjecting it to liquid immersion exposure using an ArF excimer laser (wavelength: 193 nm), carrying out development treatment, and thereby patterning the photoresist.

Figure 29:
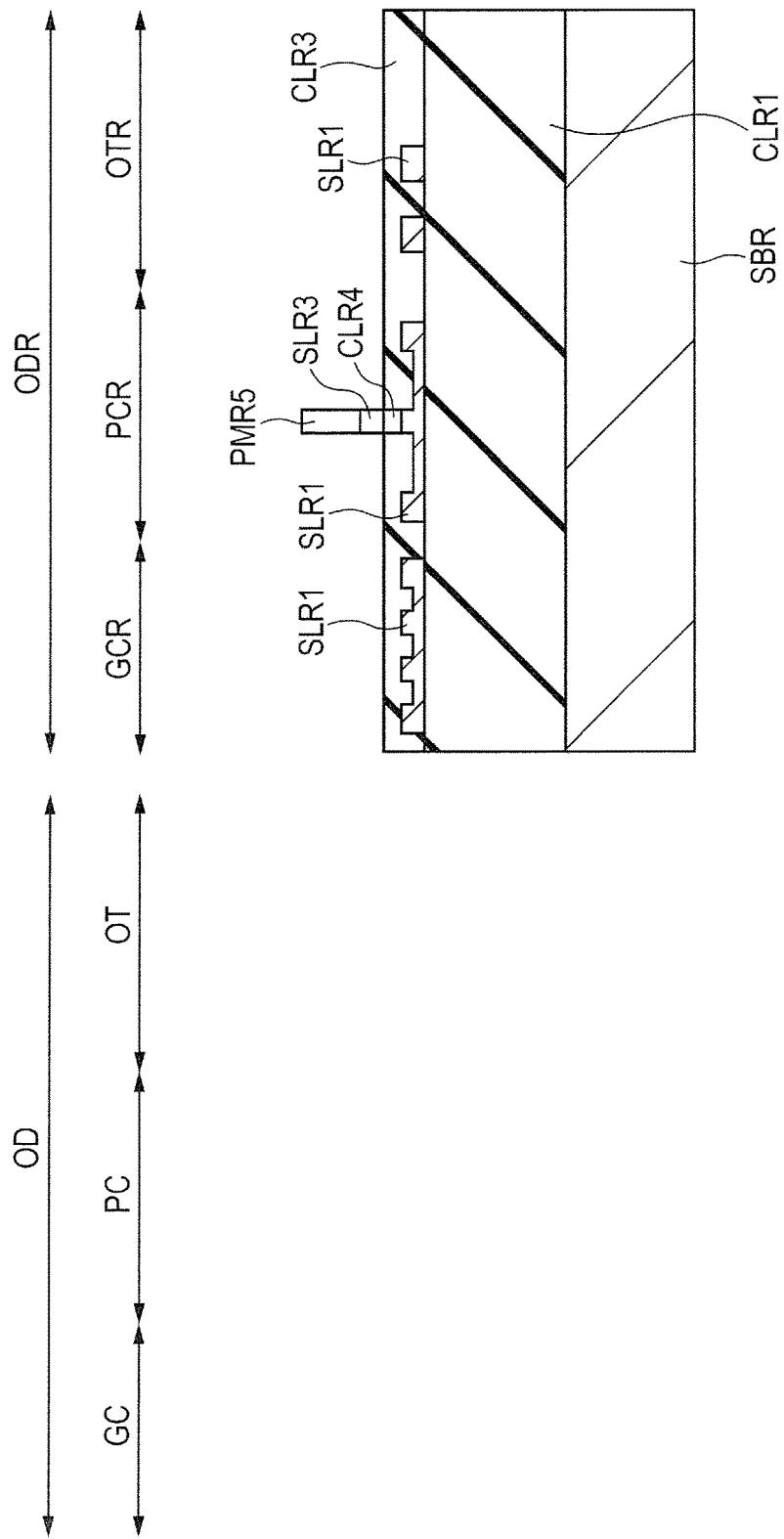
FIG. 29 is a fragmentary cross-sectional view of the optical device of Comparative Example during a manufacturing step thereof following that of FIG. 28.

Next, as shown in FIG. 29, in the comparative optical device ODR, the third semiconductor layer SLR3 is processed using the fifth resist mask PMR5 as an etching mask to leave the third semiconductor layer SLR3 on the fourth insulating layer CLR4.

Figure 30:
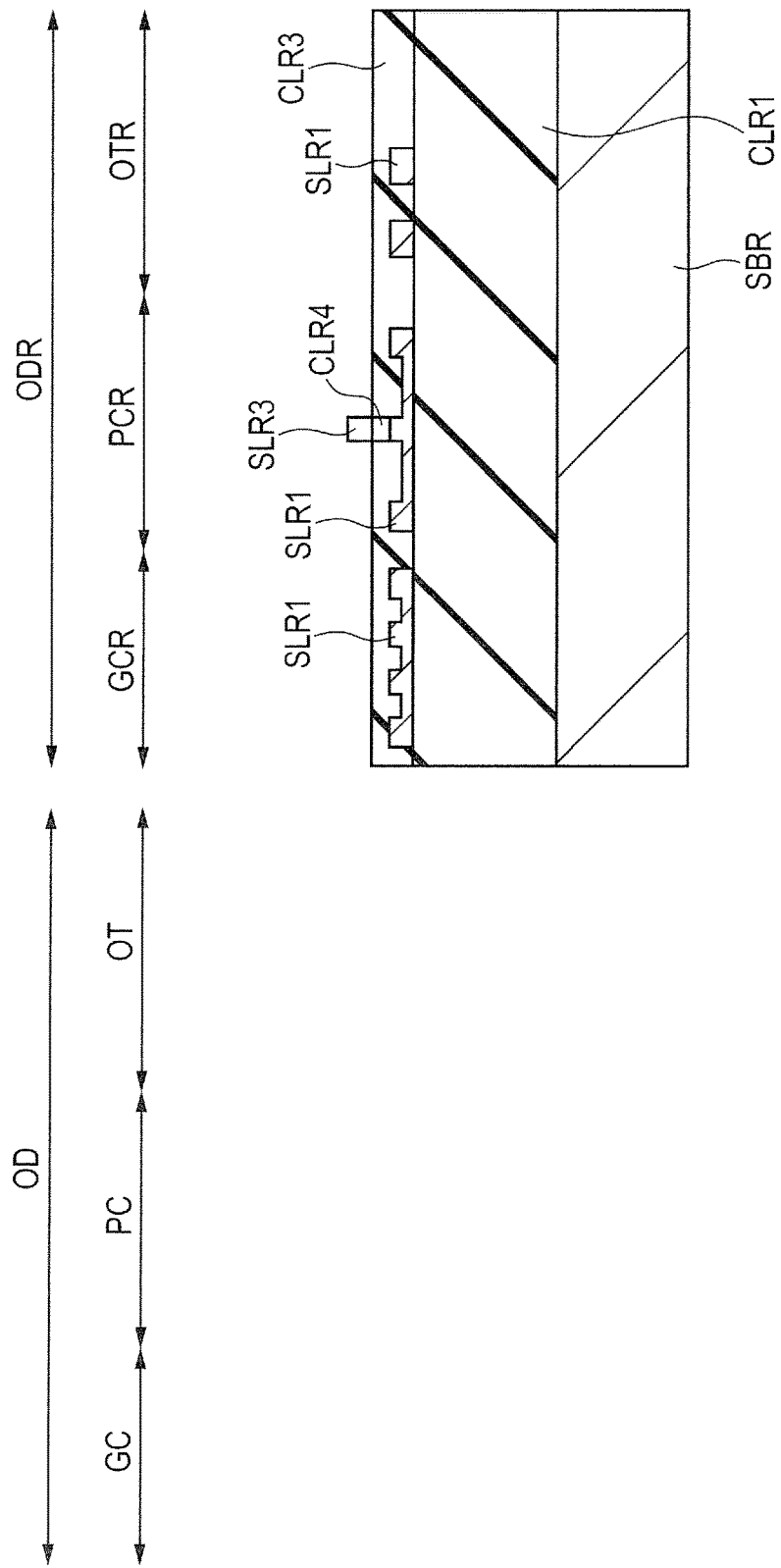
FIG. 30 is a fragmentary cross-sectional view of the optical device of Comparative Example during a manufacturing step thereof following that of FIG. 29.

Next, as shown in FIG. 30, the fifth resist mask PMR5 is removed by oxygen ($O_2$) plasma asking, followed by RCA cleaning.

By the steps so far described, in the comparative optical device ODR, the structure of the MOS optical modulator PCR is substantially completed.

The MOS optical modulator PCR has a projection which is formed of the first semiconductor layer SLR1 comprised of a p type semiconductor, the fourth insulating layer CLR4, and the third semiconductor layer SLR3 comprised of an n type semiconductor, extends in the optical waveguide direction, and will be a light propagating core layer.

Figure 31:
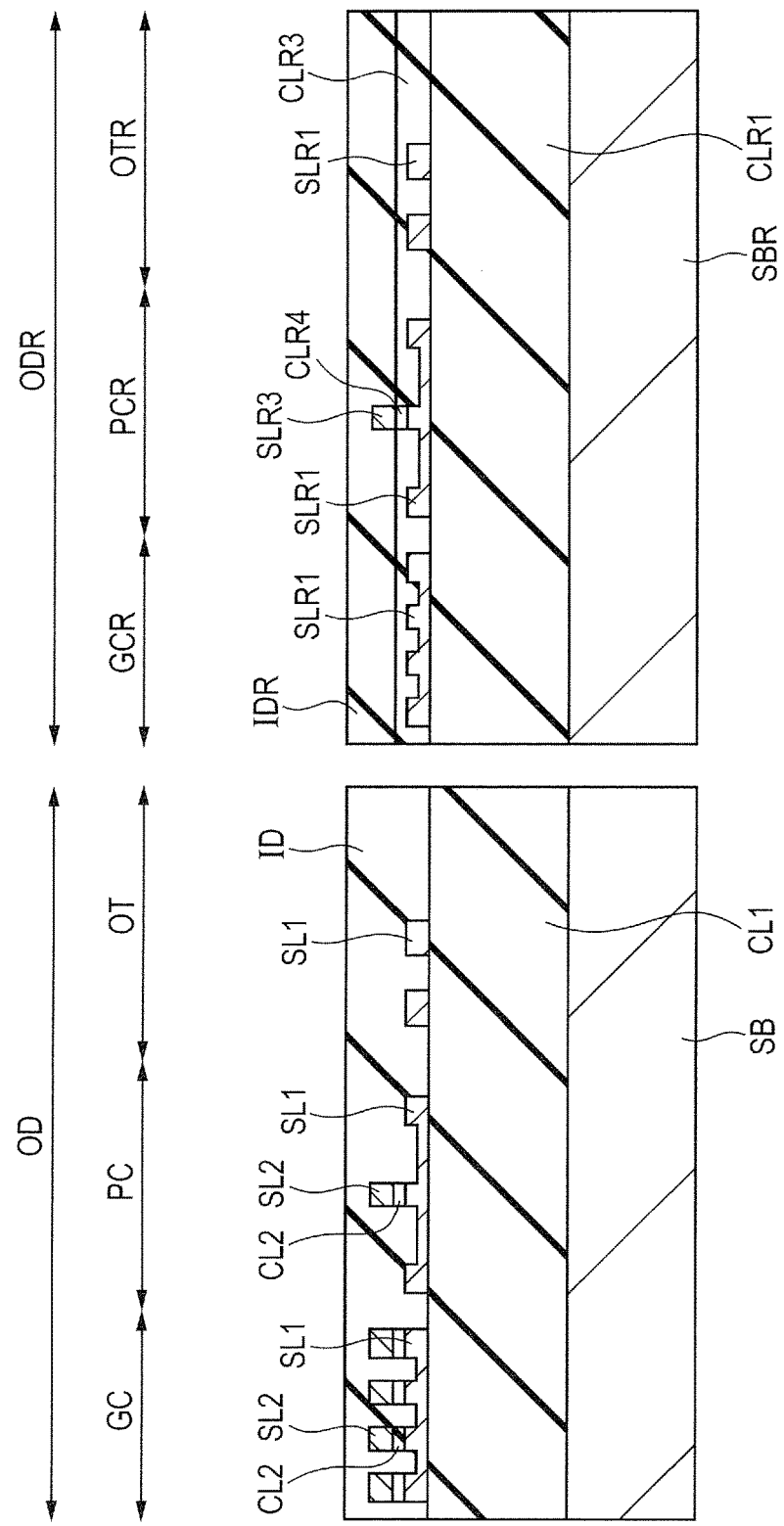
FIG. 31 includes a fragmentary cross-sectional view of the optical device of the embodiment during a manufacturing step thereof following that of FIG. 20 and a fragmentary cross-sectional view of the optical device of Comparative Example during a manufacturing step thereof following that of FIG. 30.
Figure 32:
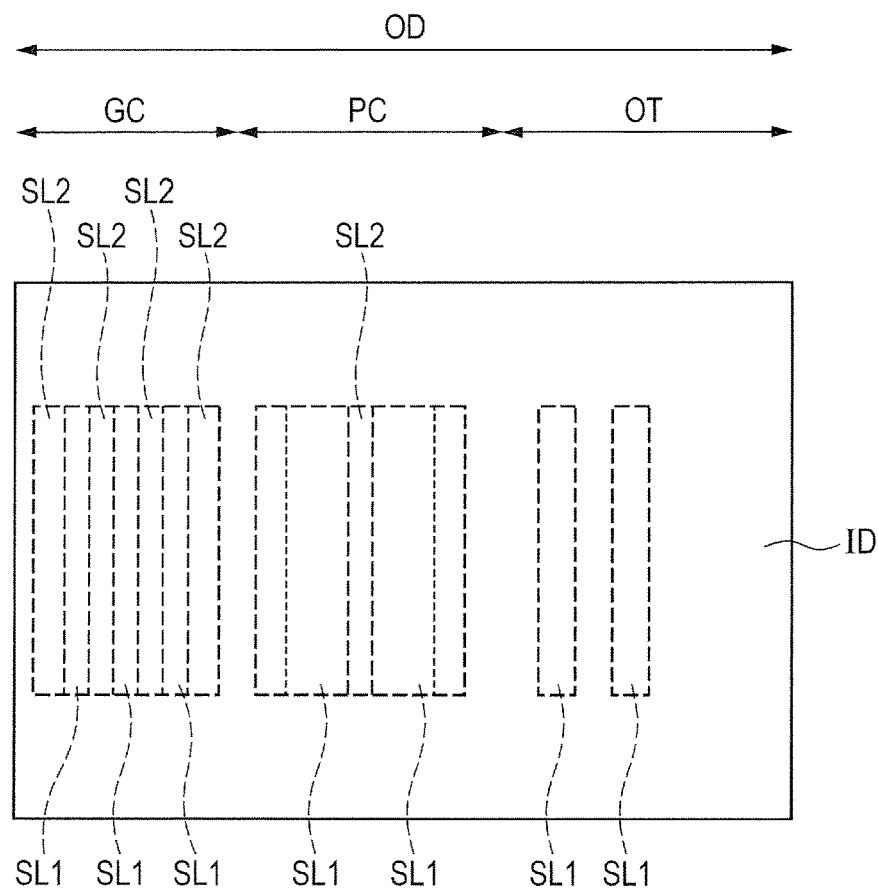
FIG. 32 is a fragmentary plan view of the optical device of the embodiment shown in FIG. 31.

Next, as shown in FIGS. 31 and 32, in the optical device OD, an interlayer insulating film ID is formed on the semiconductor substrate SB to cover the optical signal line OT, the grating coupler GC, and the MOS optical modulator PC.

In the comparative optical device ODR, an interlayer insulating film IDR is formed on the semiconductor substrate SBR to cover the optical signal line OTR, the grating coupler GCR, and the MOS optical modulator PCR.

In the comparative optical device ODR, the p type semiconductor configuring the core layer of the MOS optical modulator PCR can be manufactured in steps common to those of the grating coupler GCR, but steps for manufacturing an insulating layer between the p type semiconductor and the n type semiconductor and the n type semiconductor should be added. This increases the number of manufacturing steps to 17. In the optical device OD, on the other hand, the p type semiconductor configuring the core layer of the MOS optical modulator PC, the insulating layer between the p type semiconductor and the n type semiconductor, and the n type semiconductor can be manufactured by steps common to those for the grating coupler GC so that the number of manufacturing steps required so far is 11. The number of manufacturing steps of the optical device OD becomes smaller than that of the comparative optical device ODR so that the former device can be manufactured at a reduced production cost.

Then, as shown above in FIG. 1, in the optical device OD and the comparative optical device, coupling holes, plugs, wirings, and the like are formed.

Thus, in the present embodiment, variation in refractive index is reduced because the second insulating layer CL2 between the first semiconductor layer SL1 and the second semiconductor layer SL2 configuring the core layer of the MOS optical modulator PC has improved uniform thickness. By this, the phase of light can be changed precisely in the MOS optical modulator PC. In addition, due to the stacked structure of the projection of the first semiconductor layer SL1, the second insulating layer CL2, and the second semiconductor layer SL2, the projection of the grating coupler GC can have an increased height. This makes it possible to increase the quantity of diffracted and radiated light in the grating coupler GC. Further, manufacturing the MOS optical modulator PC and the grating coupler GC by the steps common to them leads to a decrease in the number of manufacturing steps of the semiconductor device and also a decrease in the production cost thereof.

Modification Example of Embodiment

A method of manufacturing an optical device of Modification Example of the present embodiment will be described in order of steps referring to FIGS. 33 to 36. FIGS. 33 to 36 are fragmentary cross-sectional views of the optical device of Modification Example of the present embodiment.

In the above-described embodiment (refer to FIG. 2), the second semiconductor layer SL2 comprised of single crystal silicon (Si) is formed by laminating wafers. The method of forming the second semiconductor layer SL2 is however not limited thereto.

A method of forming the second semiconductor layer SL2 in Modification Example of the present embodiment will hereinafter be described. Manufacturing procedures other than the method of forming the second semiconductor layer SL2 are almost similar to the manufacturing steps of the above-described embodiment (refer to FIGS. 2 to 21 and FIGS. 31 to 32) so that a description on them is omitted.

Figure 33:
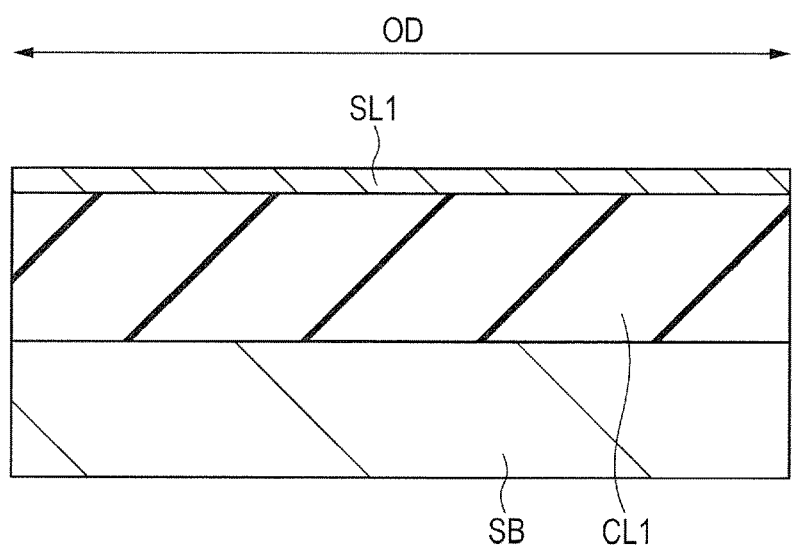
FIG. 33 is a fragmentary cross-sectional view of the optical device of Modification Example of the embodiment during a manufacturing step thereof.

First, as shown in FIG. 33, a substrate (a substrate having a substantially round plane and called, in this stage, "wafer") comprised of a semiconductor substrate SB, a first insulating layer CL1 formed on the main surface of the semiconductor substrate SB, and a first semiconductor layer SL1 formed on the first insulating layer CL1 is provided. The semiconductor substrate SB is a support substrate comprised of single crystal silicon (Si) and it has a thickness of, for example, about 750 μm. The first insulating layer CL1 is comprised of, for example, silicon oxide ($SiO_2$) and it has a thickness of, for example, about 2.0 μm. The first semiconductor layer SL1 is comprised of, for example, single crystal silicon (Si) and it has a thickness of, for example, about 0.2 μm.

Figure 34:
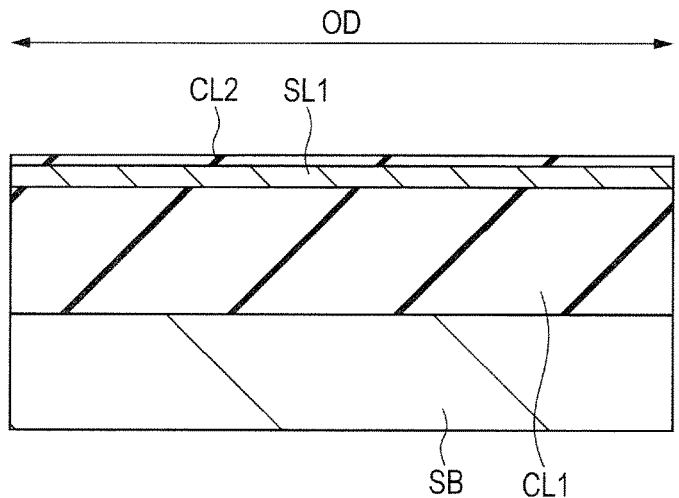
FIG. 34 is a fragmentary cross-sectional view of the optical device of Modification Example during a manufacturing step thereof following that of FIG. 33.

As shown in FIG. 34, thermal oxidation is performed to form a second insulating layer CL2 on the surface of the first semiconductor layer SL1. The second insulating layer CL2 is comprised of, for example, silicon oxide ($SiO_2$) and it has a thickness of, for example, from about 0.002 μm to 0.01 μm and as a typical value of it, 0.005 μm can be given as an example. The second insulating layer CL2 can also be formed by CVD (chemical vapor deposition) instead of thermal oxidation.

Figure 35:
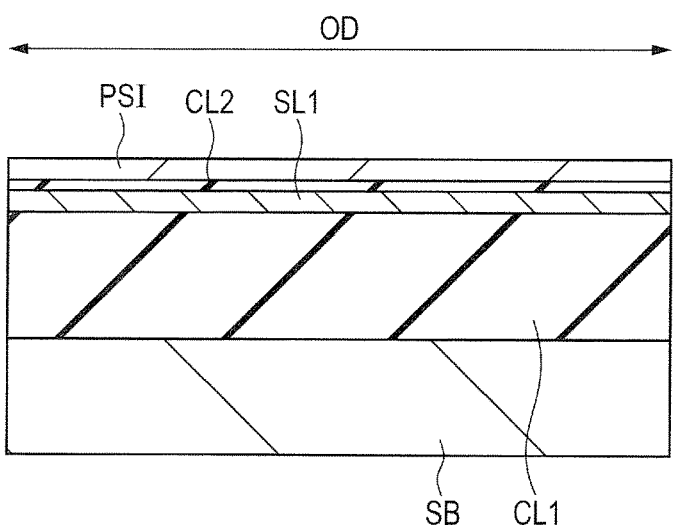
FIG. 35 is a fragmentary cross-sectional view of the optical device of Modification Example during a manufacturing step thereof following that of FIG. 34.

Next, as shown in FIG. 35, a polycrystalline silicon (Si) film PSI is formed on the upper surface of the second insulating layer CL2 by CVD. The polycrystalline silicon film PSI is formed at a temperature of, for example, from about 600° C. to 700° C. and it has a thickness of, for example, from about 0.1 μm to 0.3 μm.

Figure 36:
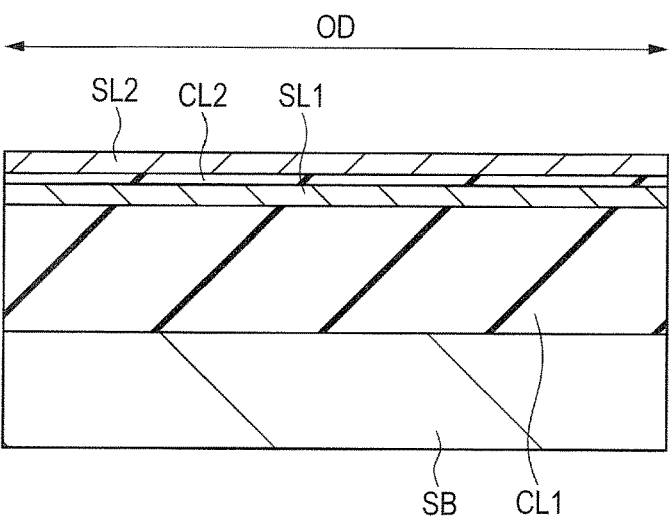
FIG. 36 is a fragmentary cross-sectional view of the optical device of Modification Example during a manufacturing step thereof following that of FIG. 35.

Next, as shown in FIG. 36, the polycrystalline silicon film PSI is heat treated for recrystallization. The heat treatment is performed at a temperature of, for example, from about 700° C. to 800° C. in a heat treatment atmosphere of, for example, nitrogen ($N_2$). By this heat treatment, a second semiconductor layer SL2 comprised of single crystal silicon (Si) is formed.

Thus, Modification Example of the present embodiment in which the second semiconductor layer SL2 comprised of single crystal silicon (Si) is formed by recrystallization of polycrystalline silicon (Si) can produce, in addition to the advantage produced by the above-described embodiment, another advantage, that is, a reduction in the production cost compared with the above-described embodiment in which the second semiconductor layer SL2 is formed by laminating wafers.

The invention made by the present inventors has been described specifically based on the embodiment. It is needless to say that the invention is not limited to or by this embodiment but can be changed in various ways without departing from the gist of the invention.

What is claimed is:

1. A semiconductor device, comprising
a semiconductor substrate;
a first insulating layer formed over a main surface of the semiconductor substrate;
a grating coupler formed in a first region over the first insulating layer;
an optical modulator formed in a second region which is a region different from the first region over the first insulating layer; and
an interlayer insulating film formed over the first insulating layer such that the interlayer insulating film covers the grating coupler and the optical modulator,
wherein the grating coupler comprises:
a plurality of first projections separated from each other in an optical waveguide direction; and
a first slab portion formed between any two of the first projections adjacent to each other, formed integrally with the first projections, and having a height lower than that of the first projections, and
wherein the optical modulator comprises:
a second projection extending in the optical waveguide direction; and
second slab portions formed on both sides of the second projection, respectively, formed integrally with the second projection, and having a height lower than that of the second projection,
wherein the first projections and the second projection each are formed of first semiconductor layer, a second insulating layer, and a second semiconductor layer stacked successively over the first insulating layer, and the first slab portion and the second slab portions each are formed of the first semiconductor layer.

2. The semiconductor device according to claim 1,
wherein the first semiconductor layer and the second semiconductor layer each are comprised of single crystal silicon.

3. The semiconductor device according to claim 1,
wherein the second insulating layer is comprised of silicon oxide, and
wherein the second insulating layer has a thickness of 0.002 μm or more and 0.01 μm or less.

4. The semiconductor device according to claim 1,
wherein the first insulating layer and the second insulating layer each are comprised of silicon oxide, and
wherein the second insulating layer has a thickness smaller than a thickness of the first insulating layer.

5. The semiconductor device according to claim 1,
wherein the second semiconductor layer has a thickness of 0.1 μm or more and 0.3 μm or less.

6. The semiconductor device according to claim 1,
wherein the first semiconductor layer configuring the optical modulator has a conductivity type different from the conductivity type of the second semiconductor layer configuring the optical modulator.

7. The semiconductor device according to claim 1,
wherein the first semiconductor layer configuring the first slab portion has a thickness smaller than a thickness of the first semiconductor layer configuring a portion of the first projections, and
wherein the first semiconductor layer configuring the second slab portion has a thickness smaller than a thickness of the first semiconductor layer configuring a portion of the second projection.

8. A method of manufacturing a semiconductor device equipped with a grating coupler and an optical modulator, comprising the steps of:
(a) providing a substrate obtained by successively forming, over a main surface of a semiconductor substrate, a first insulating layer, a first semiconductor layer, a second insulating layer, and a second semiconductor layer formed from the side of the main surface of the semiconductor substrate;

(b) successively processing the second semiconductor layer, the second insulating layer, and the first semiconductor layer by etching in a first region in which the grating coupler is to be formed and a second region in which the optical modulator is to be formed, and thereby forming, in the first region, a plurality of first projections formed of the first semiconductor layer, the second insulating layer, and the second semiconductor layer and separated from each other in an optical waveguide direction, and a first slab portion formed of the first semiconductor layer and positioned between any two of the first projections adjacent to each other, and forming, in the second region, a second projection formed of the first semiconductor layer, the second insulating layer, and the second semiconductor layer and extending along the optical waveguide direction, and second slab portions having the first semiconductor layer and positioned on both sides of the second projection, respectively; and (c) successively removing the second semiconductor layer, the second insulating layer, and the first semiconductor layer from a region around the first region and the second region, wherein the first semiconductor layer and the second semiconductor layer each are comprised of single crystal silicon, and wherein the first insulating layer and the second insulating layer each are comprised of silicon oxide.

9. The method of manufacturing a semiconductor device according to claim 8, wherein the step (a) further comprises the sub-steps of:

(a1) successively forming, from the side of the main surface of the semiconductor substrate, the first insulating layer and the first semiconductor layer over the main surface of the semiconductor substrate;

(a2) forming the second insulating layer over the first semiconductor layer by thermal oxidation or CVD;

(a3) forming a polycrystalline silicon film over the second insulating layer by CVD; and (a4) heat treating the polycrystalline silicon film to recrystallize the polycrystalline silicon film and thereby forming the second semiconductor layer comprised of single crystal silicon.

10. The method of manufacturing a semiconductor device according to claim 8, wherein the second insulating layer has a thickness of 0.002 μm or more and 0.01 μm or less.

11. The method of manufacturing a semiconductor device according to claim 8, wherein the second insulating layer has a thickness smaller than the thickness of the first insulating layer.

12. The method of manufacturing a semiconductor device according to claim 8, wherein the second semiconductor layer has a thickness of 0.1 μm or more and 0.3 μm or less.

13. The method of manufacturing a semiconductor device according to claim 8, wherein the first semiconductor layer in the second region has a conductivity type different from a conductivity type of the second semiconductor layer in the second region.

14. The method of manufacturing a semiconductor device according to claim 8, wherein in the step (b), the first semiconductor layer configuring the first slab portion is half-etched to make a thickness of the first semiconductor layer configuring the first slab portion smaller than a thickness of the first semiconductor layer configuring a portion of the first projections, and wherein the first semiconductor layer configuring the second slab portion is half-etched to make a thickness of the first semiconductor layer configuring the second slab portion smaller than a thickness of the first semiconductor layer configuring a portion of the second projection.

* * * * *